(12) United States Patent
Miura et al.

(10) Patent No.: US 6,512,707 B2
(45) Date of Patent: Jan. 28, 2003

(54) SEMICONDUCTOR INTEGRATED CIRCUIT DEVICE ALLOWING ACCURATE EVALUATION OF ACCESS TIME OF MEMORY CORE CONTAINED THEREIN AND ACCESS TIME EVALUATING METHOD

(75) Inventors: Manabu Miura, Hyogo (JP); Makoto Hatakenaka, Hyogo (JP)

(73) Assignee: Mitsubishi Denki Kabushiki Kaisha, Chiyoda-ku (JP)

( * ) Notice: Subject to any disclaimer, the term of this patent is extended or adjusted under 35 U.S.C. 154(b) by 0 days.

(21) Appl. No.: 09/837,164

(22) Filed: Apr. 19, 2001

(65) Prior Publication Data

US 2001/0055226 A1 Dec. 27, 2001

(30) Foreign Application Priority Data

Jun. 20, 2000 (JP) ......................... 2000-184445

(51) Int. Cl.[7] .......................... G11C 7/00; G11C 29/00
(52) U.S. Cl. .................... 365/194; 365/201; 365/220; 365/189.05
(58) Field of Search ................... 365/194, 201, 365/220, 189.05

(56) References Cited

U.S. PATENT DOCUMENTS

| | | | | |
|---|---|---|---|---|
| 5,301,193 A | * | 4/1994 | Toyofuku et al. | 370/395.4 |
| 6,259,647 B1 | * | 7/2001 | Ooishi | 365/189.01 |
| 2002/0041532 A1 | * | 4/2002 | Watanabe et al. | 365/219 |

FOREIGN PATENT DOCUMENTS

JP       10-21700       1/1998

* cited by examiner

*Primary Examiner*—David Nelms
*Assistant Examiner*—Ly Duy Pham
(74) *Attorney, Agent, or Firm*—Burns, Doane, Swecker & Mathis, LLP

(57) ABSTRACT

An external clock signal is transmitted as a clock signal to a memory core through a first signal transmitting path. In response to activation of the clock signal CLK, memory core starts a read operation. Read data output from memory core is latched by a latch circuit. An external signal designating a latch timing is transmitted as a latch timing signal to the latch circuit through a second signal transmitting path. A delay circuit is provided in at least one of the first and second signal transmitting paths, so that the first and second signal transmitting paths come to have the same signal delay.

9 Claims, 25 Drawing Sheets

SEMICONDUCTOR INTEGRATED CIRCUIT DEVICE ALLOWING ACCURATE EVALUATION OF ACCESS TIME OF MEMORY CORE CONTAINED THEREIN AND ACCESS TIME EVALUATING METHOD

BACKGROUND OF THE INVENTION

1. Field of the Invention

The present invention relates to a semiconductor integrated circuit device and, more specifically, to a semiconductor integrated circuit device having a test function of evaluating operation delay time (access time) of a memory core contained therein, and to an access time evaluating method.

2. Description of the Background Art

In a semiconductor integrated circuit device such as represented by a microprocessor, data I/O width (number of parallel bits) has been extended, memory capacitor has been increased and operation frequency has been increased, in order to achieve higher performance.

Typically, a DRAM/logic mixed memory having a logic portion and a DRAM (Dynamic Random Access Memory) as a memory core mounted together on one same chip has been developed in order to realize wide data I/O width, to cope with those applications that require especially wide memory band width such as image processing. In the DRAM/logic mixed memory, an I/O pin and an external bus, which existed between a conventional processor and the DRAM are omitted, enabling a configuration capable of data transfer with high degree of freedom, and a number of data I/O lines capable of simultaneous data input/output to and from DRAM array portion are provided, realizing wide data I/O width.

For accurate operation of such a semiconductor integrated circuit device, it is necessary to accurately evaluate operation delay (access time) of the memory core. Here, as the data I/O width has been increased and the memory comes to have larger capacity, there arises the problem of increased circuit area and the increased test time necessary for testing the memory core.

As a solution to this problem, a technique of evaluating the access time of the memory core in a short period of time by a small scale test circuit is disclosed, for example, in Japanese Patent Laying-Open No. 10-21700. In the following, the technique disclosed in this laid-open application will be simply referred to as the prior art technique.

FIG. 30 is a block diagram representing a configuration of a first test circuit in accordance with the prior art technique.

Referring to FIG. 30, the first test circuit in accordance with the prior art technique includes a test target macro M1 that corresponds to the memory core, a selector M2 and a latch circuit M3.

The test target macro M1 starts a reading operation at a timing in response to a clock signal CLK, and provides read data DO1 to DOn. Selector M2 receives the read data DO1 to DOn from test target macro M1, and outputs one read data corresponding to a select signal SEL to latch circuit M3. Latch circuit M3 latches, in response to an activation timing of a test clock signal TCK, an output from selector M2, and provides this as a test output signal TDO.

In the first test circuit in accordance with the prior art technique, timing difference from an activation timing of dock signal CLK until an activation timing of test clock signal TCK is changed while monitoring the corresponding test output signal TDO, whereby the access time of the test target macro M1 can be evaluated.

More specifically, when the timing difference is smaller than the access time of the test target macro M1, it means that at a timing when latch circuit M3 latches the read data selected by selector M2, a correct read data has not yet been transmitted, and therefore the read data cannot be output as the test output signal TDO. When the timing difference is equal or longer than the access time of test target macro M1, latch circuit M3 provides the correct read data as the test output signal TDO.

In the configuration of the first test circuit in accordance with the prior art technique shown in FIG. 30, the influence of internally generated propagation delay of clock signal CLK and test clock signal TCK is not considered.

Therefore, when the access time is evaluated based on the activation timing difference at the time of generation of the clock signal CLK and the test clock signal TCK, a time difference between a first signal delay of the clock signal CLK from external input until reception by the test target macro M1 and a second signal delay of the test clock signal TCK from external input until reception by the latch circuit M3 may possibly affect the evaluation of the access time as an error. When the data I/O width is wide, circuit scale of selector M2 will be formidable.

Particularly, current trend is to make severe an operation specification of the memory core that corresponds to the test target macro, and therefore desired specification value of the access time comes to be smaller. When the required access time becomes shorter, the influence of the error resulting from the time difference between the first and second signal delays mentioned above becomes more significant.

FIG. 31 is a block diagram representing a configuration of a second test circuit in accordance with the prior art technique.

Referring to FIG. 31, the second test circuit in accordance with the prior art technique differs from the test circuit shown in FIG. 30 in that a multi-input logic gate M4 is additionally provided. The multi-input logic gate M4 receives read data DO1 to DOn from test target macro M1, and outputs a result of logical operation of the read data. Accordingly, the read data having the longest delay time is output, in an equivalent manner, from multi-input logic gate M4, and therefore, the area of selector M2 can be reduced. Further, as evaluation of the access time for each read data becomes unnecessary, the time for evaluating the access time can be reduced.

If the second test circuit is to be applied to the logic/DRAM mixed memory as described above, however, the circuit scale of the multi-input logic gate M4 would be very large, corresponding to the wide data I/O width. Further, the read data for evaluating the access time is transmitted to latch circuit M3 after the additional process time by multi-input logic gate M4, and therefore, an error factor is newly added in addition to the delay difference between the first and second signals described above. Therefore, highly accurate evaluation meeting the more severe access time requirement is difficult.

It is possible to evaluate the access time of the memory core by integrally operating the logic portion and the memory core in the case of the logic/DRAM (memory core) mixed memory. More specifically, a test mode is set in that the logic portion operates in response to an output from the DRAM (memory core), and the frequency of an external clock signal applied to the logic/DRAM mixed memory. Evaluation can be done by monitoring whether the logic portion operates normally or not.

By this method, however, it is necessary to increase the frequency of the external clock signal to execute highly accurate measurement of the access time, and therefore, there is a problem that the access time of the memory core cannot be evaluated unless a relatively expensive high speed tester is used.

SUMMARY OF THE INVENTION

An object of the present invention is to provide a semiconductor integrated circuit device capable of accurately evaluating an access time of a memory core contained therein, and to provide an access time evaluating method.

In summary, the present invention provides a semiconductor integrated circuit device including a memory circuit, a first signal transmitting path, a first data latch circuit and a second signal transmitting path.

The memory circuit executes a reading operation in which a plurality of data are output in parallel. One of the plurality of data is transmitted to an internal node. The first signal transmitting path transmits a control signal for instructing start of the reading operation to the memory circuit. The first data latch circuit takes in and holds a signal level of the internal node in response to a test timing signal that is activated after a prescribed time period from the activation of the control signal. The second signal transmitting path transmits the test timing signal to the first data latch circuit. A signal delay circuit is provided at least in one of the first and second signal transmitting paths, so as to make equal the signal propagation delay through the first and second signal transmitting paths.

According to another aspect, the present invention provides an access time evaluating method for a memory circuit contained in a semiconductor integrated circuit device, including the steps of: activating a control signal for instructing start of a reading operation in which a plurality of data are output in parallel, to the memory circuit; transmitting the activated control signal to the memory circuit; after a prescribed time period from the activation of the control signal, activating a test timing signal in response to a signal activated independent from the control signals; transmitting the activated test timing to a latch circuit; responsive to activation of the transmitted test timing signal, taking and holding in a latch circuit, at least one of the plurality of data output from the memory circuit; and further delaying at least one of the control signal and the test timing signal, and transmitting the delayed one to at least corresponding one of the memory circuit and the latch circuit.

According to a still another aspect, the present invention provides a semiconductor integrated circuit device including a memory circuit, a signal transmitting path, a delay circuit, and a data latch circuit. The memory circuit executes a reading operation in which a plurality of data are output in parallel. The signal transmitting path transmits a control signal for instructing start of a reading operation to the memory circuit. The delay circuit receives the control signal from the signal transmitting path, and generates an internal timing signal by delaying the control signal. The data latch circuit takes and holds at least one of the plurality of data in response to the internal test timing signal.

According to a still further aspect, the present invention provides an access time evaluating method of a memory circuit contained in a semiconductor integrated circuit device, including the steps of: activating a control signal for instructing start of reading to the memory circuit; transmitting the activated control signal to the memory circuit; delaying the control signal by a prescribed time period to generate a test timing signal; and taking and holding at least one of the read data from the memory circuit, in response to the activation of the test timing signal.

Therefore, a main advantage of the present invention is that the signal delay experienced by the control signal can be made equal to the signal delay experienced by the test timing signal by the signal delay circuit, whereby the access time of the memory circuit contained in the device can be evaluated accurately.

Further, it is possible to accurately evaluate the access time of the contained memory circuit, without the necessity of inputting an external signal instructing a latch timing of the read data.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
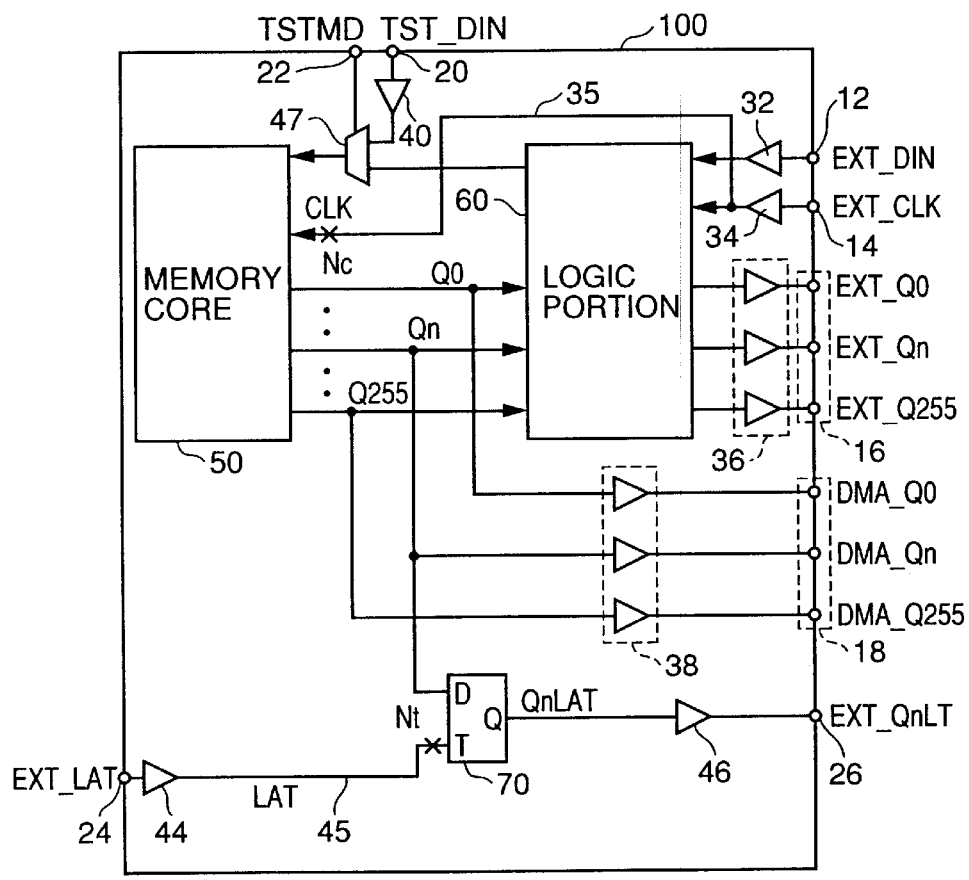
FIG. 1 is a block diagram illustrating an influence of the signal delay on access time evaluation, in a semiconductor integrated circuit device.

In the following, embodiments of the present invention will be described in detail with reference to the figures. In the figures, the same or corresponding reference characters denote the same or corresponding portions.

[Influence of Signal Delay on Access Time Evaluation]

First, referring to FIG. 1, the influence of the signal delay in the semiconductor integrated circuit device on the access time evaluation will be described.

Referring to FIG. 1, a semiconductor integrated circuit device 100, which is a logic/DRAM mixed memory, includes a memory core 50 having the data I/O width of 256 bits, and a logic portion 60.

Semiconductor integrated circuit device 100 further includes a data input/output terminal 12, a clock input terminal 14, data output terminal groups 16, 18, a test data input terminal 20, a test mode input terminal 22, a test signal input terminal 24 and a test data output terminal 26.

Semiconductor integrated circuit device 100 further includes, corresponding to these terminals, an input buffer 32, a clock buffer 34, output buffer groups 36, 38, a test input buffer 40, a selector 47 and a signal buffer 44.

Clock buffer 34 receives an external clock signal EXT_CLK and generates a clock signal CLK. The clock signal CLK is transmitted to logic portion 60 and memory core 50.

Though not shown, at an activation timing of the external clock signal EXT_CLK, logic portion 60 takes in command control signals, and based on these command control signals, generates internal control signals instructing a command to memory core 50. In response to an activation edge of the clock signal CLK, memory core 50 takes in these internal control signals, and executes a command in accordance with the internal control signals.

First, data output from memory core 50 will be described.

When logic portion 60 generates an internal control signal reflecting an externally input read command, memory core 50 takes in the internal control signal at the activation timing of the clock signal CLK, and executes a reading operation corresponding to the read command. Therefore, the timing at which the reading operation starts in memory core 50 is defined by the activation timing of the external clock signal EXT_CLK and a signal delay generated in the first signal transmitting path formed by clock buffer 34 and signal line 35.

When the reading operation is executed, memory core 50 outputs a plurality of data in parallel. In the present embodiment, it is assumed that memory core 50 outputs 256 read data Q0 to Q255 in parallel. Normally, the read data are output as data EXT_Q0 to EXT_Q255 from data output terminal group 16 through logic portion 60 and output buffer group 36. In the test mode, a test path directly outputting the read data to the outside from memory core 50 is formed, and the data are output as data DMA_Q0 to DMA_Q255 from data output terminal group 18 through output buffer group 38.

To test signal input terminal 24, a test timing signal EXT_LAT, which is used for measuring AC characteristic such as the access time, is externally input. Signal buffer 44 receives the external test timing signal EXT_LAT, and generates a latch timing signal LAT. In the test operation for evaluating the access time and the like, the test timing signal EXT_LAT and the external clock signal EXT_CLK are, in this example, supplied from the outside by a memory tester or the like.

Figure 2:
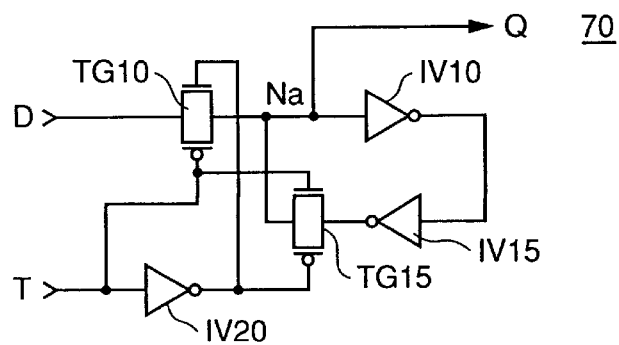
FIG. 2 is a schematic diagram showing an exemplary configuration of a latch circuit 70.

Referring. to FIG. 2, latch circuit 70 includes a transfer gate TG10 for transmitting data at an input node D to a node Na, an inverter IV10 inverting a signal level at node Na, an inverter IV15 inverting an output level of inverter IV10, and a transfer gate TG15 transmitting the output signal of inverter IV15 to node Na. Transfer gates TG10 and TG15 turn on/off complementarily, in response to the signal level of a timing control node T.

When the signal level T of the timing control node is at the H level, transfer gates TG15 and TG10 turn on and off, respectively. Consequently, input node D is disconnected from node Na, and as the transfer gate TG15 turns on, inverters IV10 and IV15 function as a latch circuit. Therefore, latch circuit 70 latches the signal level of input node D at the timing when the signal level of timing control node T has made a transition to the H level.

When the signal level T of the timing control node is at the H level, transfer gates TG15 and TG10 turn on and off, respectively. Consequently, input node D is disconnected from node Na, and as the transfer gate TG15 turns on, inverters IV10 and IV15 function as a latch circuit. Therefore, latch circuit 70 latches the signal level of input node D at the timing when th signal level of timing control node T has made a transition to the H level.

Again referring to FIG. 1, latch circuit 70 receives at the input node D, one data Qn (n: integer from 0 to 255) of 256 read data read in parallel. To the timing control node T, latch timing signal LAT is input. Therefore, the latch timing of latch circuit 70 is defined by the activation timing of test timing signal EXT_LAT and the signal delay generated in the second signal transmitting path formed by signal buffer 44 and signal line 45. The output of latch circuit 70 is output as output data EXT_QnLT from test data output terminal 26 through signal buffer 46.

As to the data input, in a normal operation, input data EXT_QIN input through data input terminal 12 is written through input buffer 32 to memory core 50, by logic portion 60. In the test operation, a test input data TST_DIN input from test data input terminal 20 is input through input buffer 40 to memory core 50. Switching between the normal operation and the test operation with respect to the data input is made by selector 47. In accordance with the signal level of the test mode signal TSTMD input to test mode input terminal 22, selector 47 transmits data output from either one of logic portion 60 and the test input buffer 40 as write data to memory core 50. Though data input terminal 12 and clock input terminal 14 are each represented by a single pin for convenience of drawing in FIG. 1, a plurality of data can be input in parallel, in the similar manner as in the data output.

Figure 3:
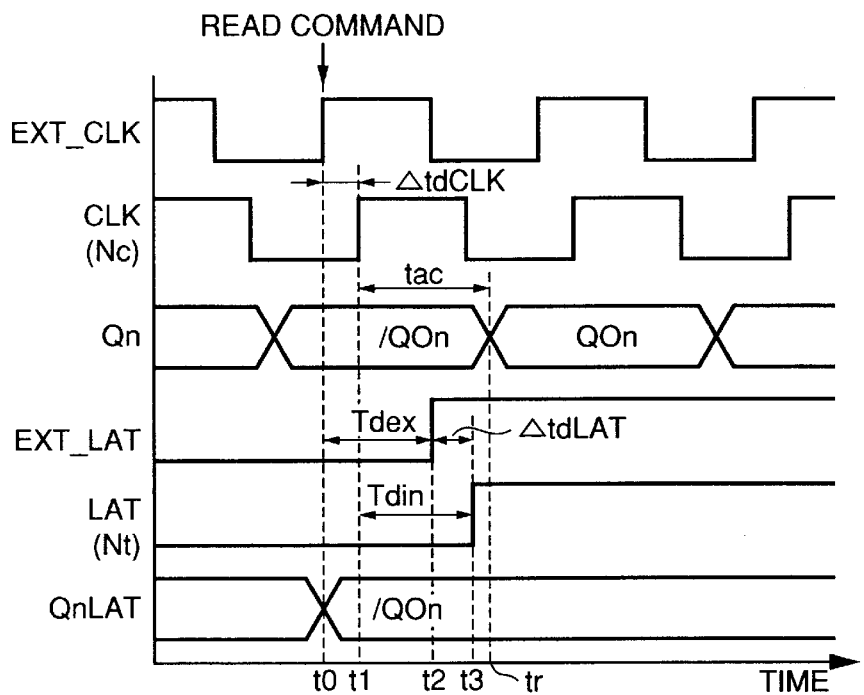
FIG. 3 is a first timing chart illustrating evaluation of an access time in a semiconductor integrated circuit device 100.

Referring to FIG. 3, at time t0, external clock signal EXT_CLK is activated by a memory tester or the like, and a read command for evaluating the access time is taken into the semiconductor integrated circuit device 100. The external clock signal EXT_CLK is transmitted as clock signal CLK, to memory core 50 through the first signal transmitting path formed by clock buffer 34 and signal line 35. At the clock input node Nc of memory core 50, at a time point t1, that is, after the lapse of ΔtdCLK corresponding to the signal delay experienced in the first signal transmitting path from time point t0, the clock signal CLK is activated.

At time t1, the read command is transmitted to memory core 50, and the reading operation of memory core 50 starts. A data level Q0n of the corresponding read data is output at time point tr. Here, the time necessary from the start of reading operation until the output of the read data, that is, the time period from t1 to tr is defined as the access time tac of memory core 50.

In the following, the data level of each read data read in response to the read command for access time evaluation will be denoted by the reference character Q0n, and data level of each read data before the input of the read command is assumed to be /Q0n, which is the data complementary to Q0n.

At a time point t2 after the lapse of a test timing difference Tdex from the time point t0, the test timing signal EXT_LAT is activated by the memory tester or the like. In response, at the point Nt corresponding to the timing control node of latch circuit 70, the latch timing signal LAT is activated at a time point t3, after the lapse of ΔtdLAT, which corresponds to the signal delay over the second signal transmitting path, from the time point t2.

At time t3, latch circuit 70 latches the signal level of read data Qn. Therefore, as shown in FIG. 3, when the latch timing signal LAT is activated at the point Nt before the time point tr at which the read data is output, the data level of latch data QnLAT is /Q0n, and the data level Q0n corresponding to the read command input at the time point t0 is not output. This means that the timing difference Tdin between the activation timing of the clock signal CLK at node Nc and the activation timing of the latch timing signal LAT at node Nt is shorter than the access time tac.

Figure 4:
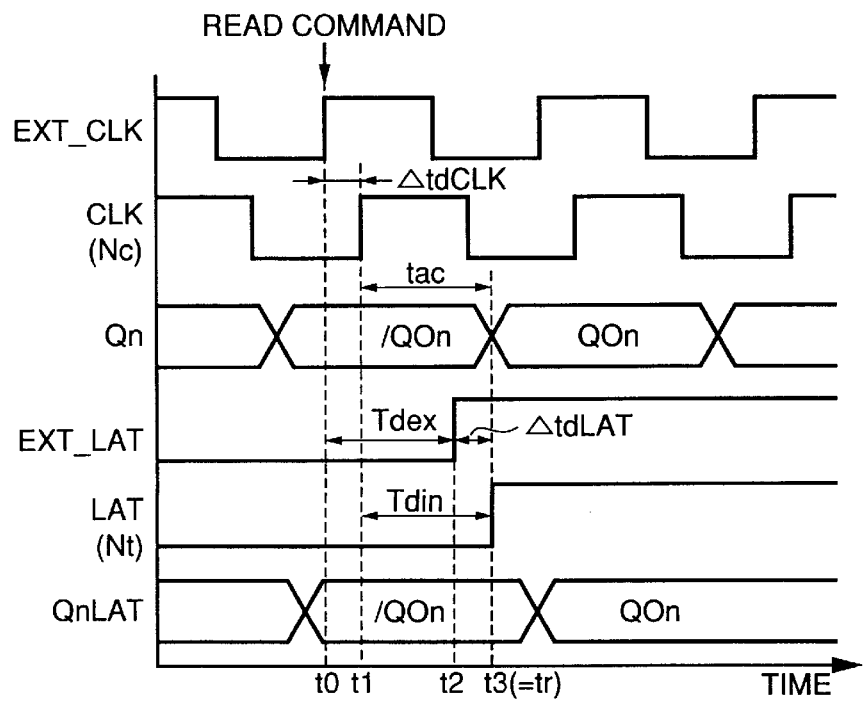
FIG. 4 is a second timing chart illustrating evaluation of an access time in semiconductor integrated circuit device 100.

Referring to FIG. 4, at time t0, the external clock signal EXT_CLK is activated at time t0, the clock signal CLK at point Nc is activated at the time point t1 and, in response, the data level Q0n corresponding to the read command appears as the read data Qn at the time point tr after the lapse of the access time tac, as in the case of FIG. 3.

In the example of FIG. 4, the time point t2, which is the timing of activation of the test timing signal EXT_LAT is later than in the example of FIG. 3. More specifically, the test timing difference Tdex from the activation of external clock signal EXT_CLK by the memory tester or the like until activation of the test timing signal EXT_LAT thereafter is longer than in FIG. 3. The signal delays ΔtdCLK and ΔtdLAT are the same as those in FIG. 1, and therefore, the timing difference Tdin between the clock signal CLK (node Nc) and the latch timing signal LAT (node Nd) also becomes longer than in FIG. 3.

FIG. 4 shows the case where the timing difference Tdin= tac, and latch circuit 70 can latch the data level Q0n corresponding to the read command. Therefore, the output data QnLAT of latch circuit 70, that is, the data level of test output data EXT_QnLT is Q0n. Where timing difference Tdin>tac, the data level of the test output data EXT_QnLT is the same as in the case of FIG. 4. Therefore, behavior of the test output data can be classified into two, that is, where Tdin<tac (FIG. 3) and where Tdin≦tac (FIG. 4). Therefore, by changing the timing difference Tdex by using a memory tester or the like and by monitoring the corresponding data level of the test output data, the access time tac can be evaluated.

When there is a difference between the signal delay ΔtdCLK of the clock signal system and the signal delay ΔtdLAT of the timing signal system shown in FIGS. 3 and 4, however, the test timing difference Tdex will be different from the timing difference Tdin that is to be compared with the access time tac actually in the semiconductor integrated circuit device. Therefore, when the access time tac is evaluated based on the externally applied test timing difference Tdex, the difference between the signal delay mentioned above affects as an error, making it difficult to attain highly precise evaluation.

[First Embodiment]

Figure 5:
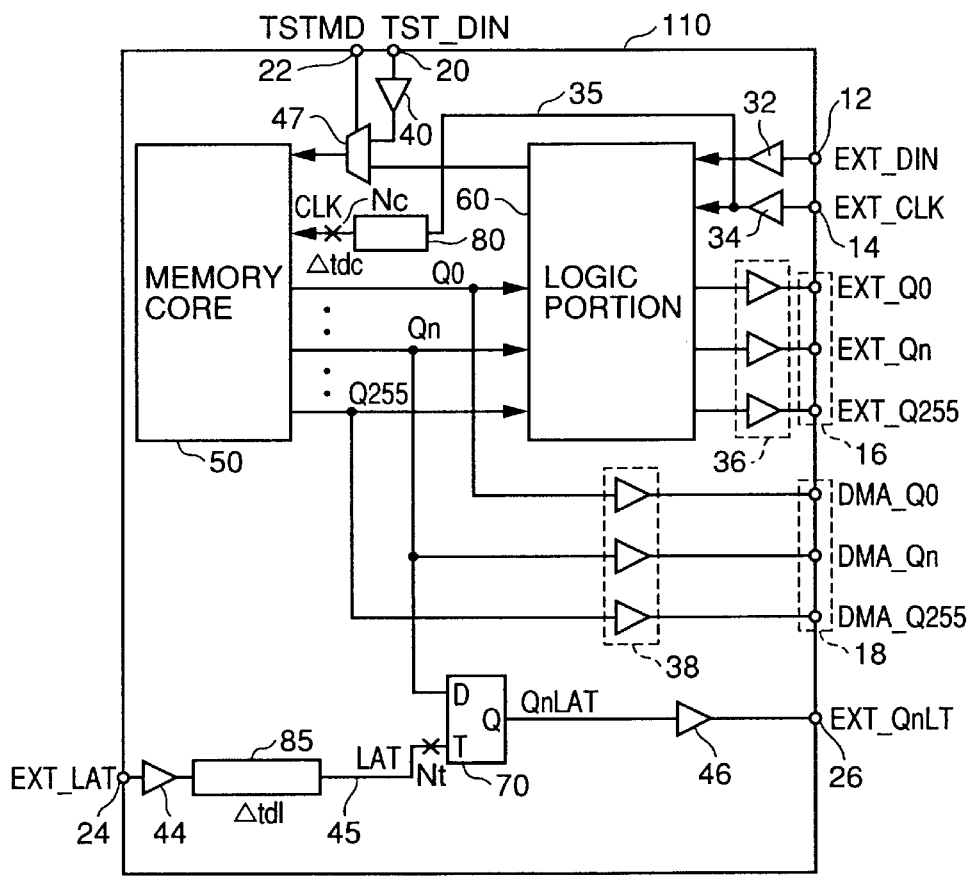
FIG. 5 is a block diagram representing a configuration of a semiconductor integrated circuit device 110 in accordance with the first embodiment of the present invention.

Referring to FIG. 5, a semiconductor integrated circuit device 110 in accordance with the first embodiment is different from semiconductor integrated circuit device 100 shown in FIG. 1 in that it further includes delay circuits 80 and 85. Delay circuit 80 is provided on a signal line 35 between clock buffer 34 and memory core 50. Delay circuit 85 is provided on a signal line 45 between signal buffer 44 and latch circuit 70. As will be described in detail later, not both of the delay circuits 80 and 85 are necessary, and one of these may be omitted as needed. Other components of semiconductor integrated circuit device 110 are similar to those of the semiconductor integrated circuit device 100, and therefore, description will not be repeated.

Figure 6:
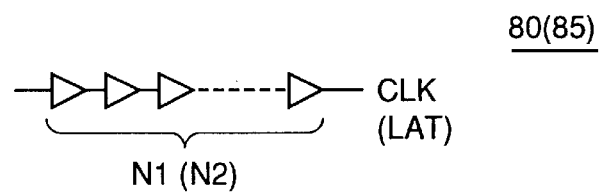
FIG. 6 is a schematic diagram representing exemplary configurations of delay circuits 80 and 85.

Referring to FIG. 6, delay circuit 80 has N1 (N1: natural number) signal buffers. Similarly, delay circuit 85 has N2 (N2: natural number) signal buffers. The delay times of delay circuits 80 and 85 can be adjusted by the number of stages N1 and N2 of the signal buffers.

Measurement of the access time in semiconductor integrated circuit device 110 will be described with reference to FIGS. 7 and 8.

Figure 7:
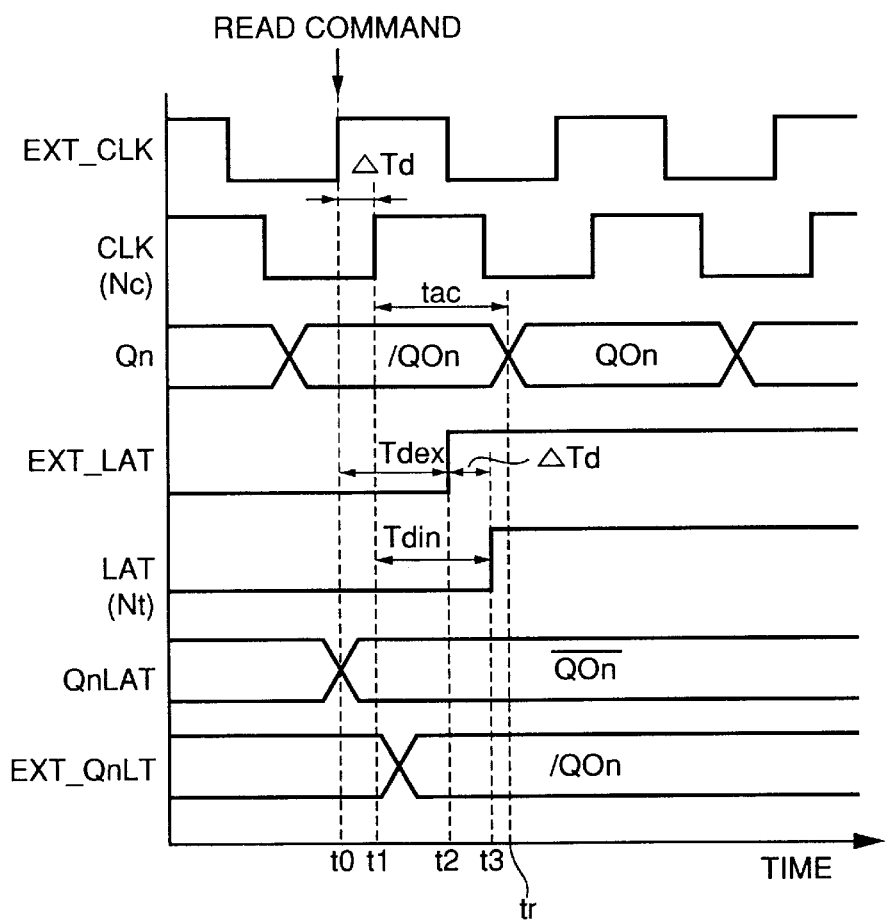
FIG. 7 is a first timing chart illustrating measurement of the access time in semiconductor integrated circuit device 110.

Referring to FIG. 7, when external clock signal EXT_CLK is activated and the read command is taken in semiconductor integrated circuit device 110 at time t0, the clock signal CLK is activated at the clock input node Nc of memory core 50 at time t1, in response. Reading operation of memory core 50 starts in response and, at time tr, the read data QOn corresponding to the read command is output from memory core 50.

In semiconductor integrated circuit device 110, the time difference between the time points t0 and t1 correspond to ΔTd, which is the sum of the inherent signal delay ΔtdCLK of the clock signal system and the delay time Δtdc intentionally added by delay circuit 80.

At time t2, the test timing signal EXT_LAT is activated at time t2, and, in response, latch timing signal LAT is activated at timing control node Nt of latch circuit 70 at time t3.

In semiconductor integrated circuit device 110, the delay times of delay circuits 80 and 85 are adjusted such that the time difference between the time points t2 and t3, that is, the sum of the inherent signal delay ΔtdLAT of the timing signal system and the delay time Δtd1 intentionally added by delay circuit 85, is equal to the time difference ΔTd between the time points t0 and t1.

Therefore, when the signal delay ΔtdCLK of the clock signal system is larger than the signal delay ΔtdLAT of the timing signal system, only the delay circuit 85 may be provided, and the number of stages N2 of the signal buffers in delay circuit 85 may be adjusted such that ΔtdLAT (ΔTd) is made equal to the line delay ΔtCLK of the clock signal system. On the contrary, when the signal delay ΔtdLAT of the timing signal system is larger than the signal delay ΔtdCLK of the clock signal system, only the delay circuit 80 may be provided and the number of stages N1 of the signal buffers in delay circuit 80 may be adjusted such that the sum of the signal delay ΔtdCLK and the delay time Δtdc of the delay circuit is made equal to ΔtdLAT (ΔTd). Alternatively, the delay circuits 80 and 85 may be both provided for the clock signal system and the test signal system and the delay times of these circuits may be adjusted such that the difference therebetween is minimized.

In this manner, by adjusting the signal delay of the clock signal system (EXT_CLK, CLK) and the signal delay of the timing signal system (EXT_LAT, LAT) to be equal to the delay time ΔTd, the difference Tdin in activation timing of the clock signal CLK (node Nc) and the latch timing signal LAT (node Nt) in semiconductor integrated circuit device 110 is made equal to the externally set test timing difference Tdex. Accordingly, it becomes possible to directly and accurately measure the access time tac of memory core 50 using the external signal timing difference Tdex.

FIG. 7 shows an example in which Tdex (=Tdin)<tac, representing the result of measurement when the test timing difference Tdex is shorter than the access time tac. Here, the data level QOn corresponding to the read command is not output as test output data EXT_QnLT.

Figure 8:
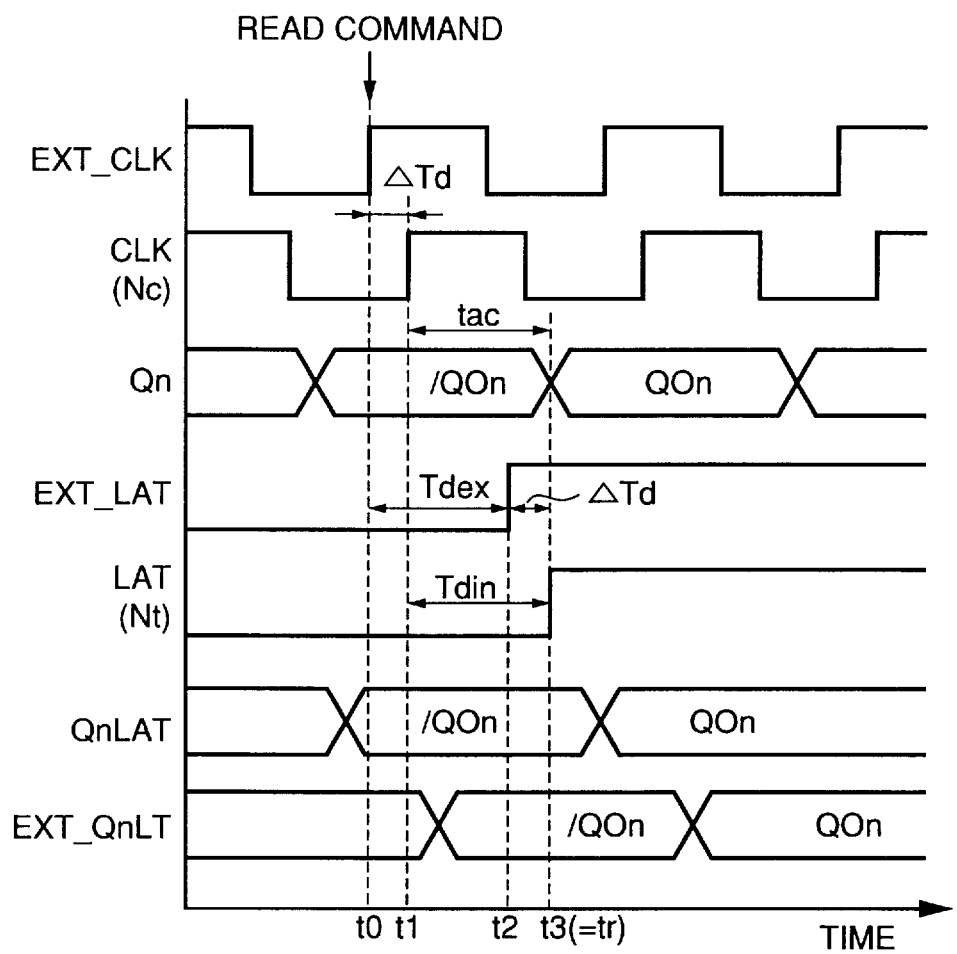
FIG. 8 is a second timing chart illustrating measurement of the access time in semiconductor integrated circuit device 110.

FIG. 8 shows an example in which Tdex (=Tdin)=tac. Here, latch circuit 70 latches read data Qn at time t3 when latch timing signal LAT is activated, and therefore test output data EXT_QnLT provides the data level QOn corresponding to the read command input at time point t0. When Tdex (=Tdin)>tac, the data level of test output data EXT_QnLT is the same as in the example of FIG. 8, and therefore, behavior of the test output data can be classified into two, that is, when Tdex (=Tdin)<tac (FIG. 7) and when Tdex (=Tdin)≧tac (FIG. 8).

Therefore, by changing the test timing difference Tdex by a memory tester or the like and by monitoring the data level of the corresponding test output data, the access time tac can be directly and accurately evaluated. More specifically, when the test timing difference Tdex is changed gradually, the minimum test timing difference Tdex at which the test output data such as shown in FIG. 8 can be obtained corresponds to the access time tac of memory core 50. Further, when the test timing difference Tdex is set to a standard value of the access time of memory core 50, it becomes possible to readily determine whether the memory core 50 satisfies the standard value of the access time, by monitoring the corresponding test output data.

Figure 9:
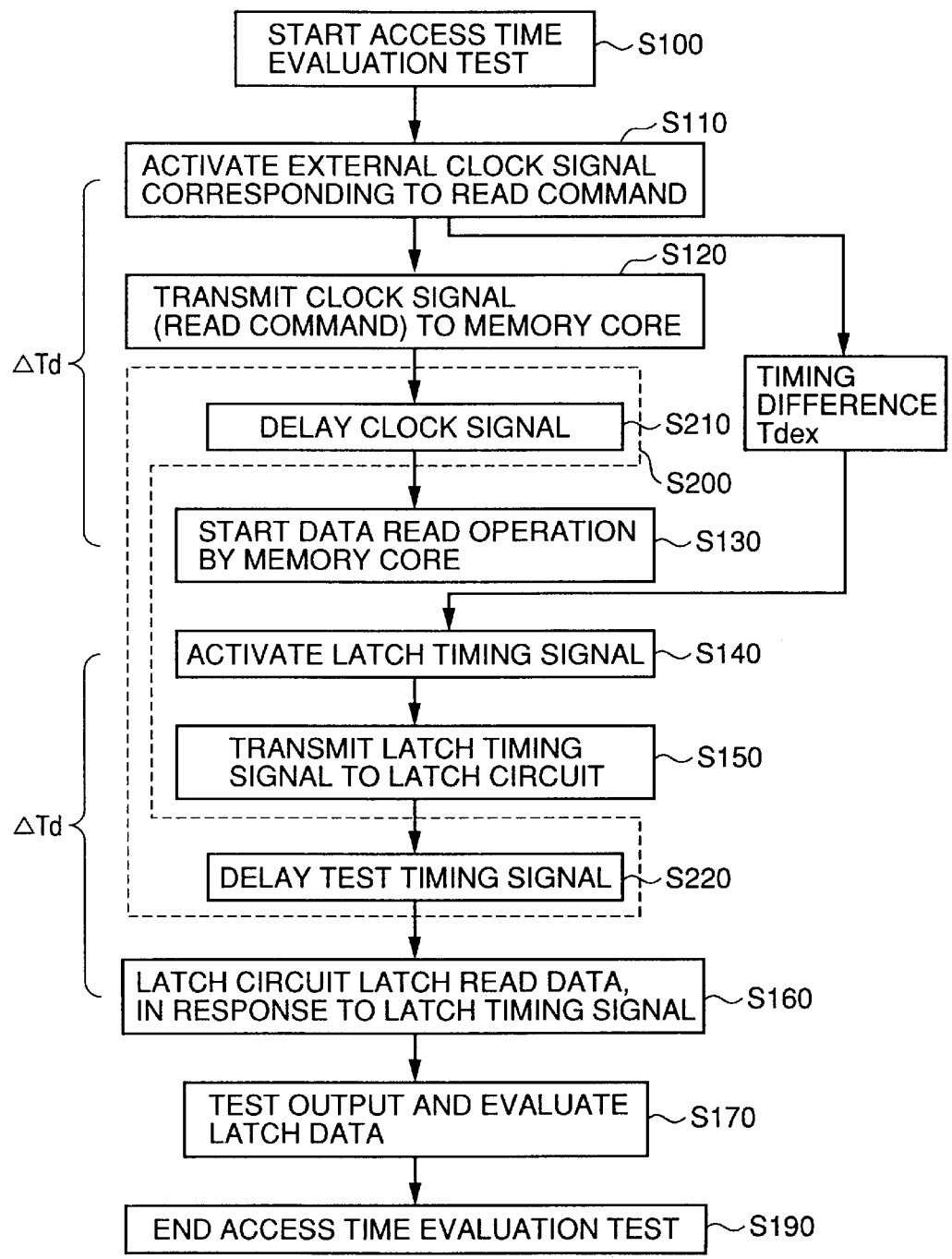
FIG. 9 is a flow chart representing the method of evaluating the access time in accordance with the first embodiment.

Referring to FIG. 9, in the method of evaluating the access time in accordance with the first embodiment, when the evaluation test of the access time starts (step S100), the external clock signal EXT_CLK is activated to take in the read command generated for access time evaluation into the semiconductor integrated circuit device 110 (step S110). Based on the external clock signal EXT_CLK, the clock signal CLK is generated and transmitted to the memory core (step S120), and in response to the activation of the clock signal CLK, reading operation of the memory core 50 starts (step S130).

After the lapse of the test timing difference Tdex from the activation of external clock signal EXT_CLK (step 110), the test timing signal EXT_LAT is activated (step S140). Based on the test timing signal EXT_LAT, the latch timing signal LAT is generated and transmitted to latch circuit 70 (step S150). At the timing when the latch timing signal LAT is transmitted to latch circuit 70, latch circuit 70 latches the data level from memory core 50 (step S160).

By further intentionally delaying at least one of the clock signal system (EXT_CLK, CLK) and the timing signal system (EXT_LAT, LAT) (step S200), the signal delay between these two signal systems is made equal. More specifically, the time taken from step S110 to S130 and time taken from steps S140 to 160 are both adjusted to be the same value of ΔTd.

When the signal delay ΔtdCLK of the clock signal system is larger than the signal delay ΔtdLAT of the timing signal system, only the step S220 may be performed so that ΔTd is made equal to the line delay ΔtdCLK of the clock signal system. Conversely, when the signal delay ΔtdLAT of the timing signal system is larger than the signal delay ΔtdCLK of the clock signal system, only the step S210 may be performed so that the sum of the signal delay ΔtdCLK and the delay time Δtdc of the delay circuit is made equal to ΔtdLAT (=ΔTd). Alternatively, both steps S210 and S220 may be performed such that the difference between the delay times of this two signal systems is minimized.

In this manner, by making equal the signal delays of the two signal systems, it becomes possible to directly evaluate the access time tac from the test timing difference Tdex, by providing the data level of the read data latched in latch circuit 70 (step S170), and to complete the access time evaluation test (step S190).

[Second Embodiment]

Figure 10:
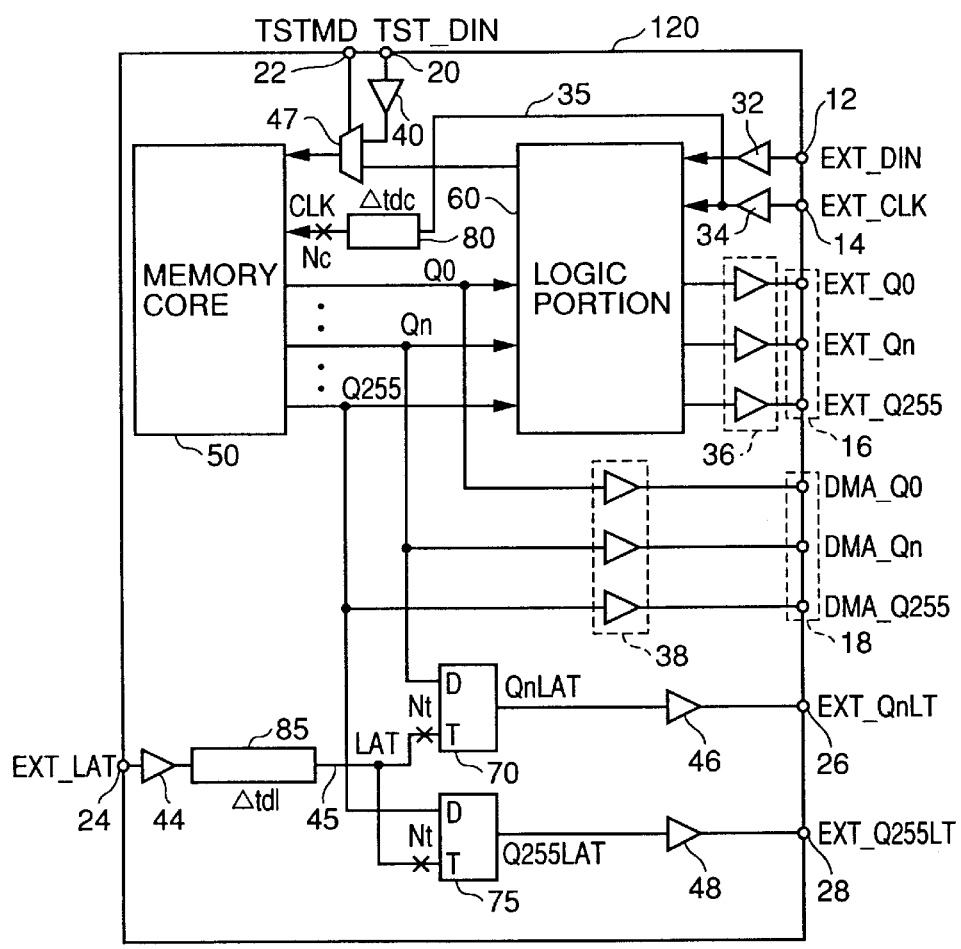
FIG. 10 is a block diagram representing a configuration of a semiconductor integrated circuit device 120 in accordance with a second embodiment of the present invention.

Referring to FIG. 10, a semiconductor integrated circuit device 120 in accordance with the second embodiment of the present invention is characterized in that a plurality of read data from memory core 50 are output through the latch circuit. FIG. 10 shows an example in which two read data are the object of access time evaluation. Semiconductor integrated circuit device 120 differs from the semiconductor integrated circuit device 110 shown in FIG. 5 in that it further includes a latch circuit 75, a test output buffer 48 and a test data output terminal 28, provided corresponding to another 1 bit of the read data from memory core 50. FIG. 10 shows, as an example, a configuration in which latch circuit 75 is newly provided for read data Q255.

Latch circuit 75 receives read data Q255 at an input node D, and is controlled by the latch timing signal LAT common to latch circuit 70. Test output buffer 48 transmits an output of latch circuit 75 to test output pin 28, and test output data EXT_Q255LT is generated at test output pin 28.

Here, measurement of the access time can be done efficiently, by selecting two read data having the fastest and the slowest access times as the objects of test outputs from the memory core 50 through the latch circuits. More specifically, dependent on the difference in interconnection path of data lines in the memory core and the like, it is possible to expect those having the fast access time and those having slow access time among read data Q0 to Q255 through a simulation or the like in the stage of designing. Therefore, read data that is expected to have the fastest access time and the read data that is expected to have the slowest access time in the stage of designing may be selected as the objects of test output. In the description below, it is assumed that read data Q255 is the data having the fastest expected access time, and read data Qn is the data having the slowest expected access time.

Measurement of the access time in semiconductor integrated circuit device 120 will be described with reference to FIGS. 11, 12 and 13.

Figure 11:
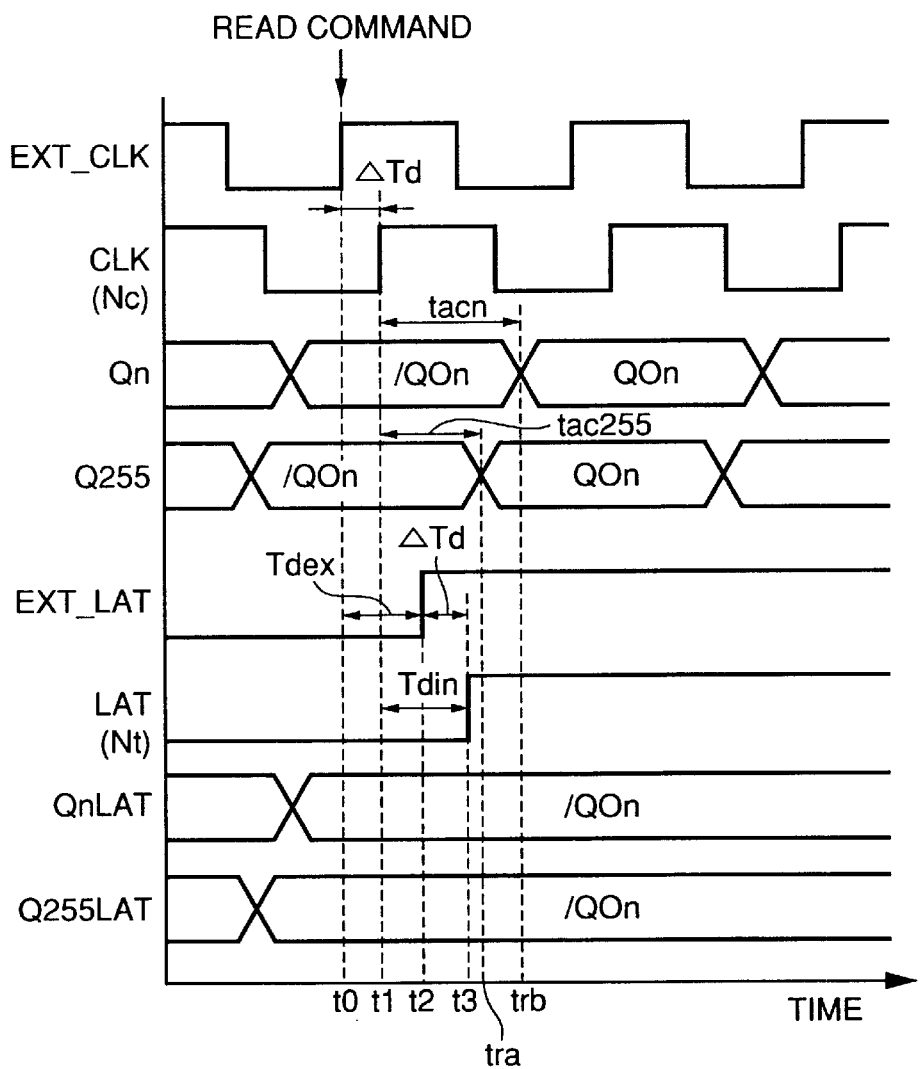
FIG. 11 is a first timing chart illustrating measurement of the access time in semiconductor integrated circuit device 120.

Referring to FIG. 11, when external clock signal EXT_CLK is activated and the read command is taken in semiconductor integrated circuit device 120 at time t0, the clock signal CLK is activated at clock input node Nc of memory core 50 at time t1 in response. The reading operation of memory core 50 starts in response, and at time points tra and trb, the data level Q0n corresponding to the read command appear as read data Q255 and Qn, respectively. Therefore, the access time corresponding to the read data Q255 is represented as tac255, and the access time corresponding to read data Qn is represented as tacn.

At time point t2, test timing signal EXT_LAT is activated, and at time point t3 after ΔTd, the latch timing signal LAT is activated at the timing control node (Nt) of latch circuits 70 and 75. The signal levels of data Qn and Q255 at time point t3 are latched as latch data QnLAT and Q255LAT by latch circuits 70 and 75, respectively, and output as test output data EXT_QnLT and EXT_Q255LT, respectively.

As already described with reference to the first embodiment, by the function of at least one of the delay circuits 80 and 85, the signal delay of the clock signal system and the signal delay of the timing signal system are adjusted to ΔTd, and therefore, it is possible to directly evaluate the access time of memory core 50 based on the test timing difference Tdex.

FIG. 11 shows an example where Tdex (=Tdin)<tacn and Tdex (=Tdin)<tac255. In this example, data levels of latch data Q255LAT and QnLAT do not change from /Q0n.

Figure 12:
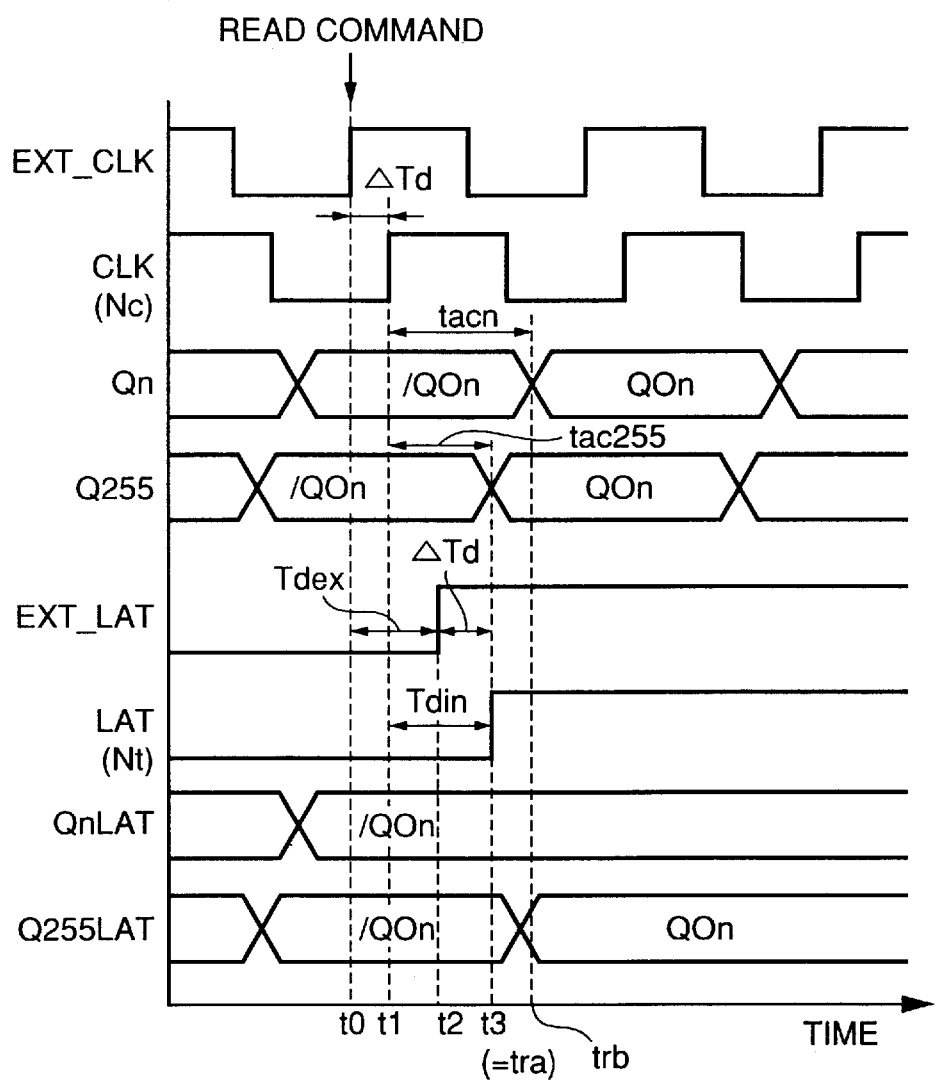
FIG. 12 is a second timing chart illustrating measurement of the access time in semiconductor integrated circuit device 120.

FIG. 12 shows an example in which Tdex (=Tdin)=tac255 and Tdx (=Tdin)<tacn, by varying the external signal timing difference Tdex. In this example, the level of latch data Q255LAT changes from /Q0n to the data level Q0n corresponding to the read command, while the data level of latch data QnLAT does not change from /Q0n.

When the latch data QnLAT and Q255LAT monitored by test output data EXT_QnLT and EXT_Q255LT exhibit such a behavior as shown in FIG. 12, it means that the test timing difference Tdex is longer than the access time tac255 for the read data which can be accessed fastest, while it is shorter than the access time tacn for the read data having the slowest access.

Figure 13:
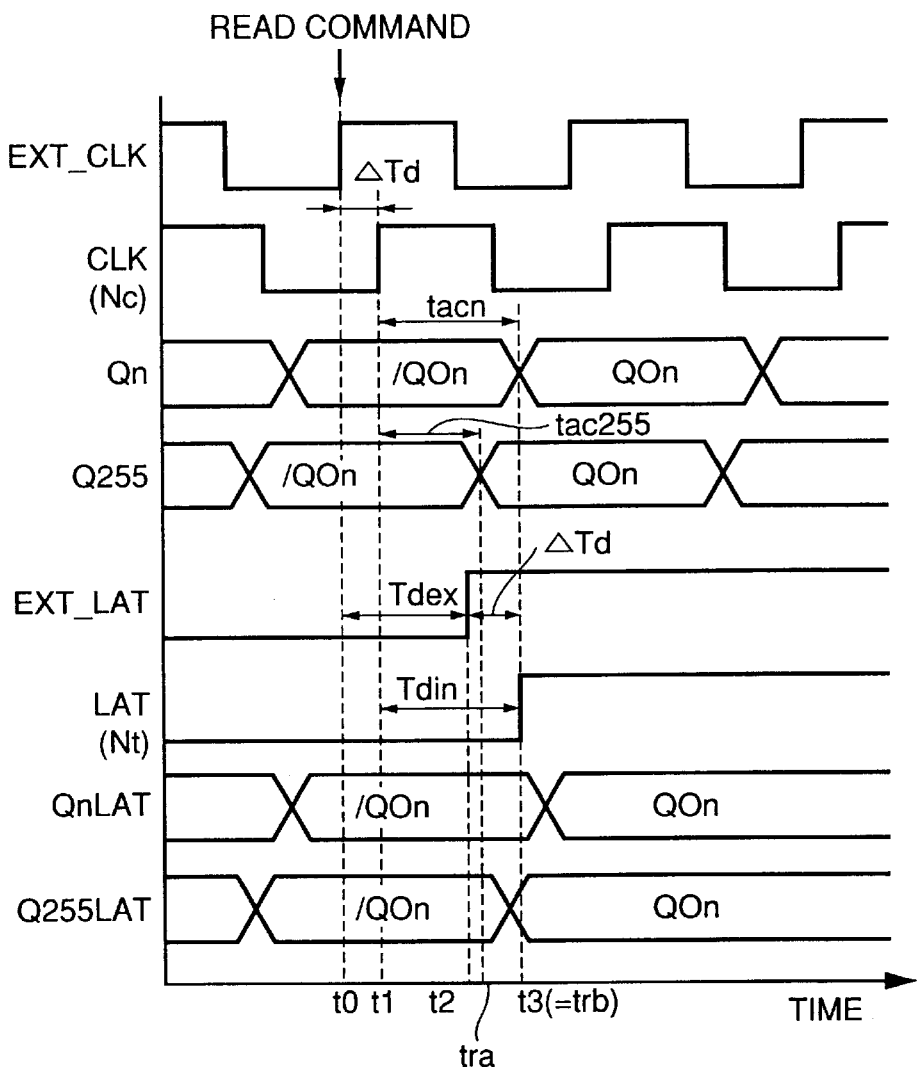
FIG. 13 is a third timing chart illustrating measurement of the access time in semiconductor integrated circuit device 120.

FIG. 13 shows an example in which the test timing difference Tdex is further increased so that Tdex (=Tdin)= tacn and Tdex (=Tdin)>tac255. In this example, data levels of latch data Q255LAT and QnLAT both change to the data level Q0n corresponding to the read command. When the latch data QnLAT and Q255 LAT monitored by test output data EXT_QnLT and EXT_Q255LT exhibit such a behavior as shown in FIG. 13, it means that the test timing difference Tdex is not shorter than the access time tacn for the read data having the slowest access.

In this manner, the access time evaluation described with reference to the first embodiment can be applied to a plurality of read data. Though a configuration in which the access time of two read data is evaluated has been described, it is possible to evaluate access time for an arbitrary number of read data, by providing additional latch circuits.

Further, by determining a read data to be the object of evaluation in accordance with the access time expected in the designing stage, it is possible to effectively evaluate access time of the memory core providing a plurality of read data in parallel.

A read data to be the object of evaluation may be determined in the similar manner in the above described first embodiment.

[Third Embodiment]

Figure 14:
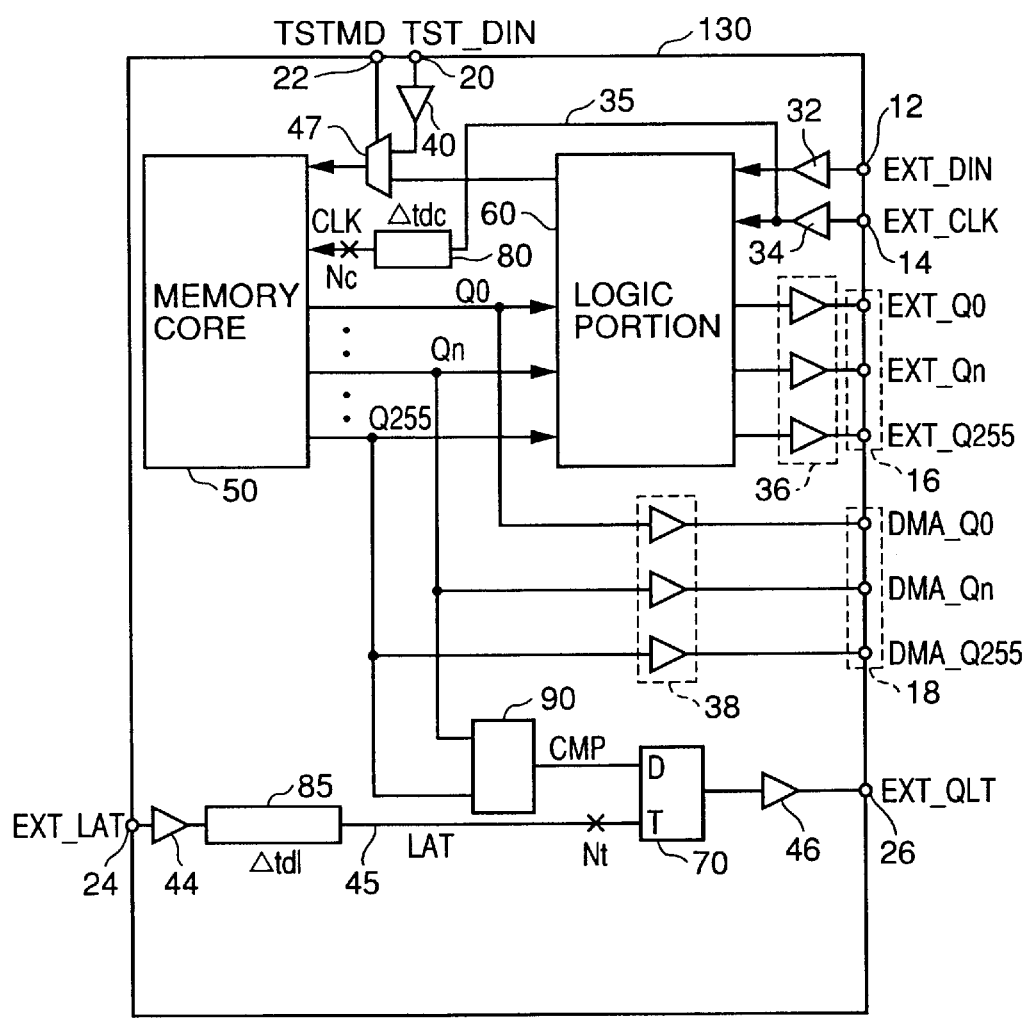
FIG. 14 is a block diagram representing a configuration of a semiconductor integrated circuit device 130 in accordance with a third embodiment of the present invention.

Referring to FIG. 14, a semiconductor integrated circuit device 130 in accordance with a third embodiment of the present invention is different from the semiconductor integrated circuit device 110 shown in FIG. 5 in that a data comparing circuit 90 is further provided. Data comparing circuit 90 compares two of the data output from memory core 50, that is, Qn and Q255 as representative examples in FIG. 13, and provides the result of comparing data levels as the comparison result signal CMP. When the signal levels of read data Qn and Q255 are the same, data comparing circuit 90 sets the comparison result signal CMP to the H level, and when the signal levels are different, sets the comparison result signal CMP to the L level.

The comparison result signal CMP output from data comparing circuit 90 is transmitted to an input node D of latch circuit 70. The configuration and operation of other portions of semiconductor integrated circuit device 130 including latch circuit 70 are the same as described above, and therefore, description will not be repeated. The read data Qn and Q255 as the objects of data comparison are also described above, and therefore, repeated description will not be given.

Access time measurement in semiconductor integrated circuit device 130 will be described with reference to FIGS. 15, 16 and 17.

Figure 15:
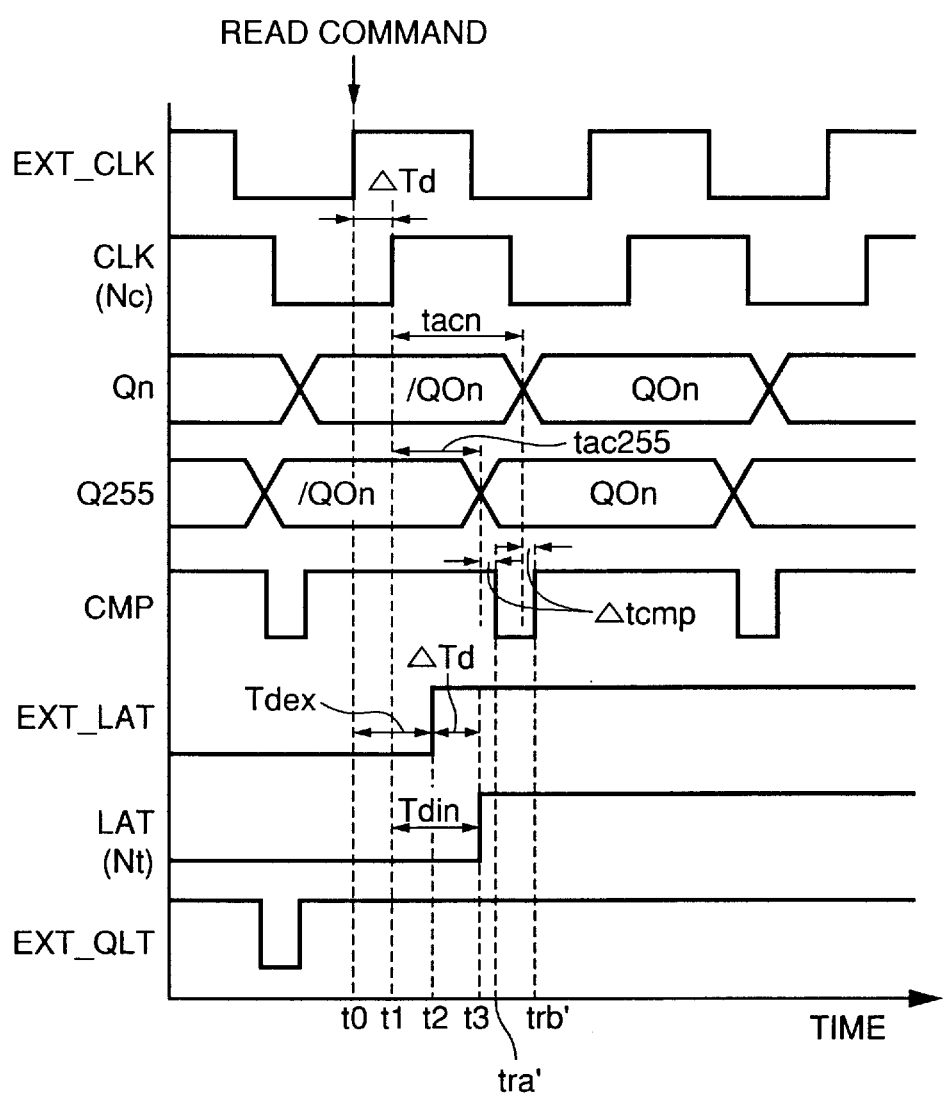
FIG. 15 is a first timing chart illustrating measurement of the access time in semiconductor integrated circuit device 130.

Referring to FIG. 15, when external clock signal EXT_CLK is activated and the read command is taken in semiconductor integrated circuit device 130 at time t0, the clock signal CLK is activated at clock input node Nc of memory core 50 at time t1, in response. The reading operation of memory core 50 starts in response, and the read data level Q0n corresponding to the read command appear at read data Q255 and Qn at time points tra and trb (not shown). Therefore, the access time corresponding to read data Q255 is represented as tac255 and the access time corresponding to read data Qn is represented as tacn.

Accordingly, the signal level of the comparison result signal changes from H level to L level and from L level to H level, respectively, at time points tra' and trb', respectively. The time difference between the time points tra and trb where the read data corresponding to the read command appears and the time points tra' and trb' at which the signal level of the comparison result signal changes corresponds to the comparing operation time Δtcmp of data comparing circuit 90.

At time t2, test timing signal EXT_LAT is activated and at time point t3 after ΔTd, latch timing signal LAT is activated at the timing control node (Nd) of latch circuit 70. The signal level of the comparison result signal CMP at time point t3 is latched by latch circuit 70 and provided as test output data EXT_QLT.

FIG. 15 shows an example in which Tdex (=Tdin) <tac255+Δtcmp and Tdex (=Tdin)<tacn+Δtcmp. After the time point t2 at which the test timing signal is activated, the data level of test output data EXT_QLT is not changed but maintained at the H level.

Figure 16:
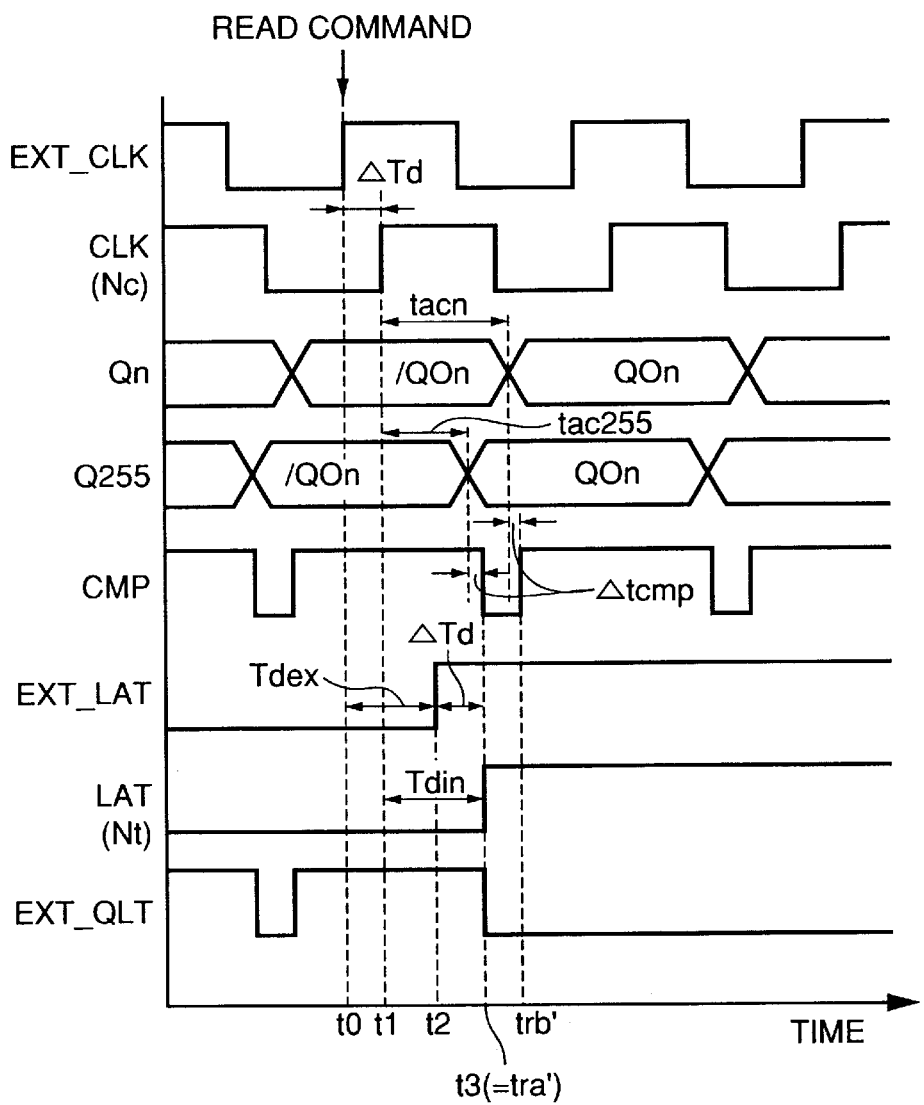
FIG. 16 is a second timing chart illustrating measurement of the access time in semiconductor integrated circuit device 130.

FIG. 16 shows an example in which the test timing difference Tdex is adjusted so that Tdex (=Tdin)=tac255+Δtcmp and Tdex (=Tdin)<tacn+Δtcmp. In this case, the data level of test output data EXT_QLT changes from the H level to the L level after time point t2, and the L level is maintained thereafter.

Figure 17:
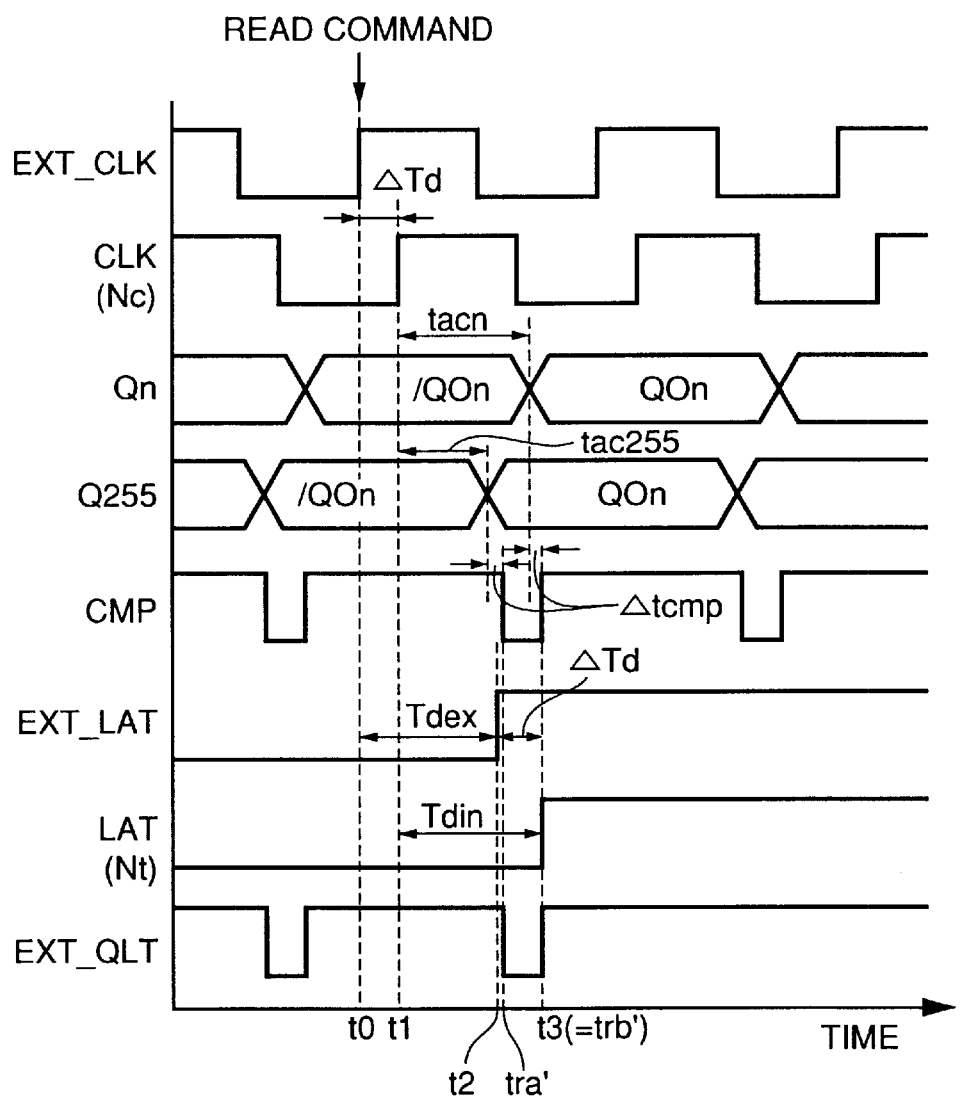
FIG. 17 is a third timing chart illustrating measurement of the access time in semiconductor integrated circuit device 130.

FIG. 17 shows an example in which the test timing difference is further enlarged so that Tdex (=Tdin)>tac255+Δtcmp and Tdex (=Tdin)=tacn+Δtcmp. Here, the data level of the test output data EXT_QLT once changes to the L level at time point tra' after the time point t2, and returns to the H level at time trb' (t3) and thereafter, maintained at the H level.

In latch circuit 90, three or more data may be compared with each other.

In this manner, in semiconductor integrated circuit device 130, it is possible to execute access time evaluation of a plurality of read data by monitoring a smaller number of test output data. Therefore, it becomes possible to reduce the number of pins used at the time of access time evaluation and to increase the number of memory cores which can be evaluated simultaneously in parallel.

Further, there is an additional effect that as compared with the semiconductor integrated circuit device 120, access time evaluation of a plurality of read data can be executed by a latch circuit provided commonly.

In the configuration of semiconductor integrated circuit device 130, an access time including the process time Δtcmp of data comparing circuit 90 is evaluated. When the number of data as the object of evaluation is limited in accordance with the access time evaluated in the design stage, for example, by using two read data having the fastest and slowest expected access time as the object of evaluation, the process time Δtcmp can be made short.

Alternatively, by taking into account the process time Δtcmp in the delay circuit 85, it becomes possible to evaluate the access time not including the process time Δtcmp.

[Fourth Embodiment]

Figure 18:
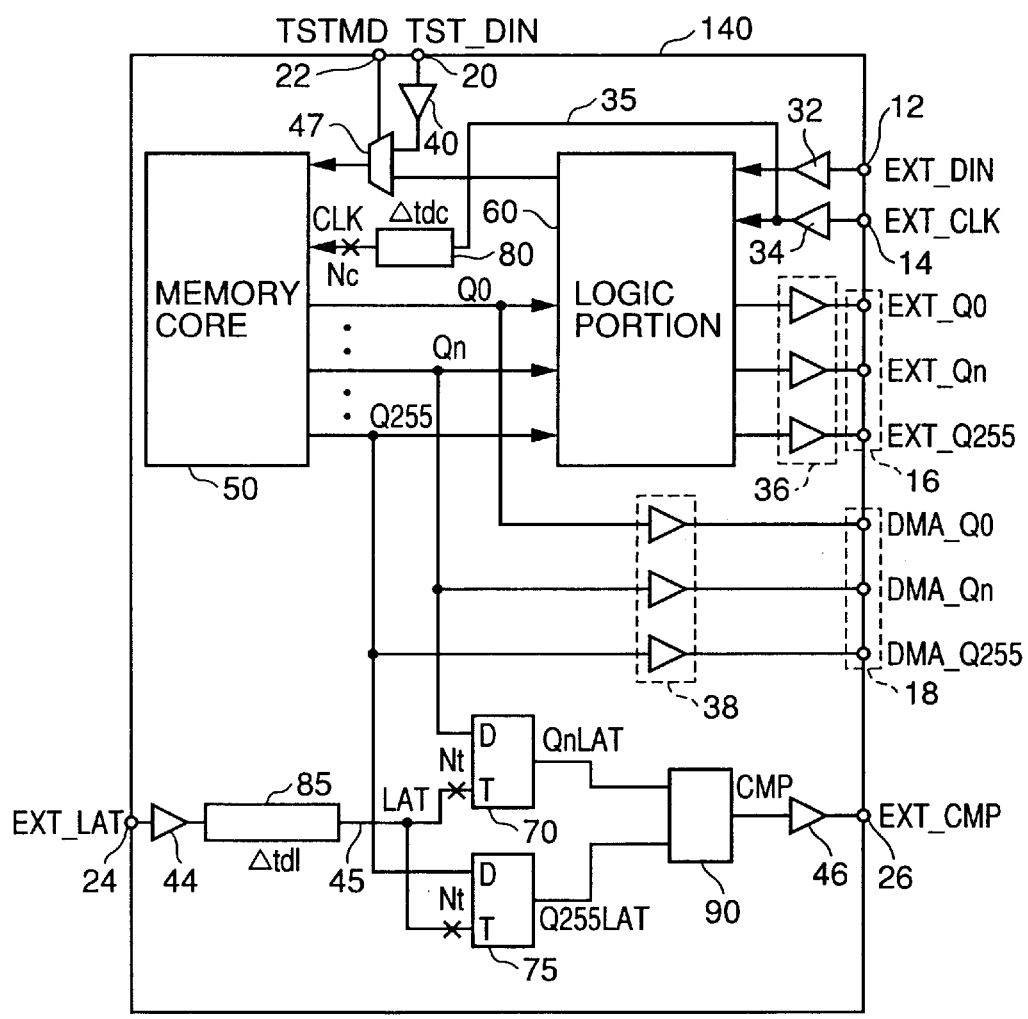
FIG. 18 is a block diagram representing a configuration of a semiconductor integrated circuit device 140 in accordance with a fourth embodiment.

Referring to FIG. 18, a semiconductor integrated circuit device 140 in accordance with the fourth embodiment differs from the semiconductor integrated circuit device 120 shown in FIG. 10 in that it further includes a data comparing circuit 90 comparing outputs of latch circuits 70 and 75. Data comparing circuit 90 outputs as a comparison result signal CMP, the result of comparison between latch data QnLAT and Q255LAT latched by latch circuits 70 and 75, respectively. When read data Qn and Q255 are of the same signal levels, the comparison result signal CMP is set to the H level, and when the signal levels are different, the comparison result signal CMP is set to the L level.

As the data comparing circuit 90 is provided, semiconductor integrated circuit device 140 provides not the outputs of latch circuits 70 and 75 but only the result of comparison therebetween the two as test output data EXT_CMP from test data output terminal 26.

Configuration and the operation of other portions of semiconductor integrated circuit device 140 are the same as those of semiconductor integrated circuit device 120 shown in FIG. 10, and therefore, description thereof will not be repeated.

By such a configuration, it becomes possible to reduce the number of pins used at the time of access time evaluation and to increase the number of memory cores that can be evaluated simultaneously in parallel.

Access time measurement in semiconductor integrated circuit device 140 will be described with reference to FIGS. 19, 20 and 21.

Figure 19:
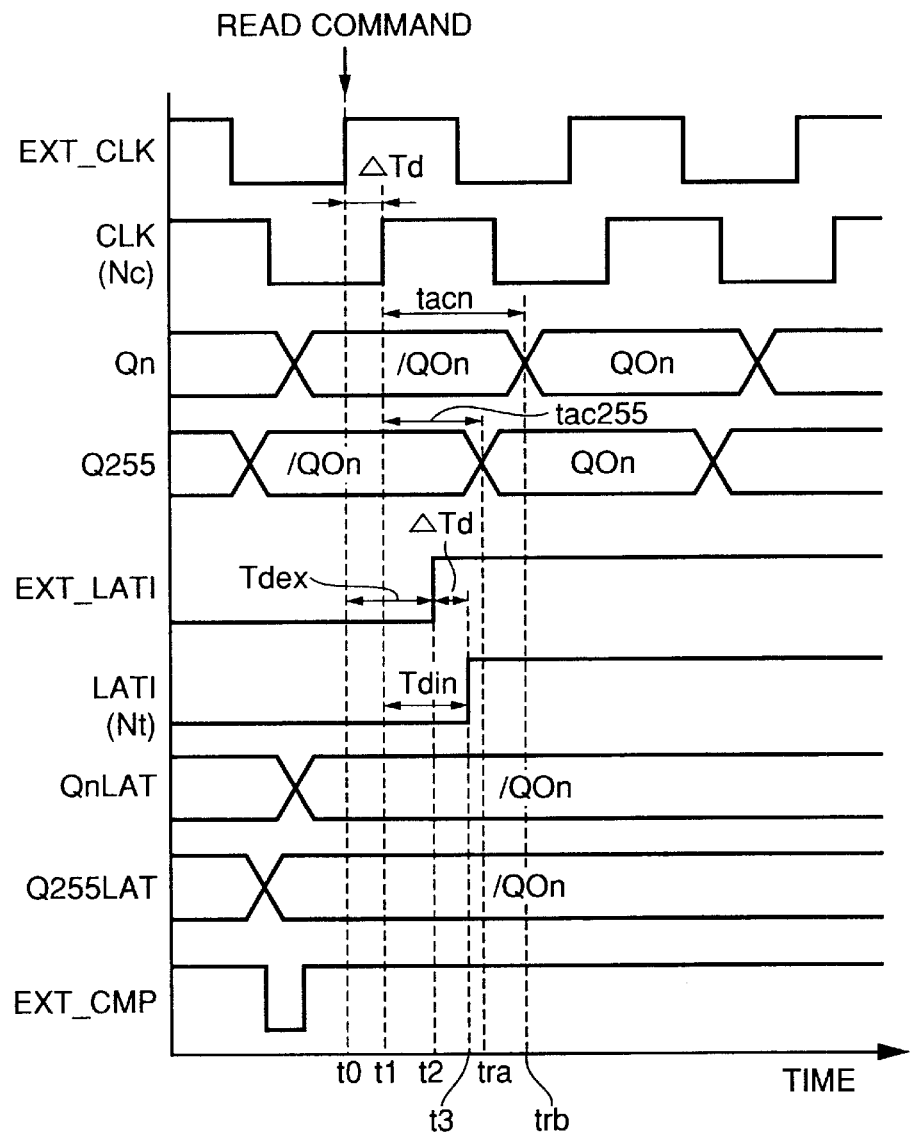
FIG. 19 is a first timing chart illustrating measurement of the access time in semiconductor integrated circuit device 140.

Referring to FIG. 19, latch data QnLAT and Q255LAT output from latch circuits 70 and 75 in response to the external clock signal EXT_CLK and test timing signal EXT_LAT are the same as those of FIG. 11, and therefore, description thereof will not be repeated.

In semiconductor integrated circuit device 140, data comparing circuit 90 is provided in a succeeding stage of latch circuits 70 and 75. Therefore, different from the third embodiment, the process time Δtcmp of data comparing circuit 90 does not have any influence on the evaluation of the access time based on the test timing difference. Therefore, the access time can be evaluated directly and accurately based on the test timing difference Tdex.

FIG. 19 shows an example in which Tdex (=Tdin)<tacn and Tdex (=Tdin)<tac255, and after the time point t2 at which test timing signal EXT_LAT is input, the test output data EXT_CMP is not changed but kept at H level.

Figure 20:
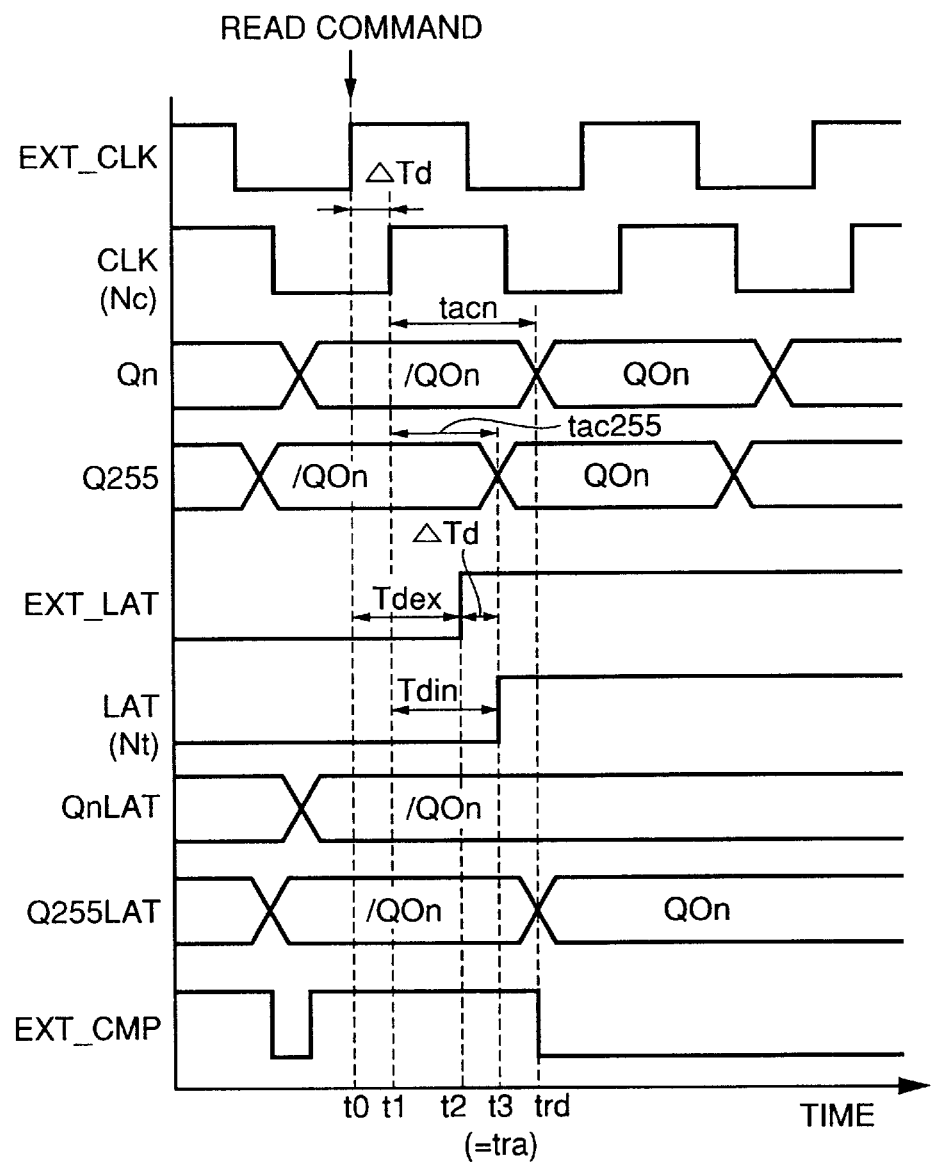
FIG. 20 is a second timing chart illustrating measurement of the access time in semiconductor integrated circuit device 140.

FIG. 20 shows an example in which the external signal timing difference Tdex is changed so that Tdex (=Tdin)= tac255 and Tdex (=Tdin)<tacn. In this example, the data level of test output data EXT_CMP changes from H level to the L level after the time point t2, and the L level is maintained thereafter. When the test output data EXT_CMP exhibits such a behavior as shown in FIG. 20, it means that the test timing difference Tdex is longer than the access time tac255 corresponding to the read data which can be accessed fastest, but it is shorter than the access time tacn for the read data of the slowest access.

Figure 21:
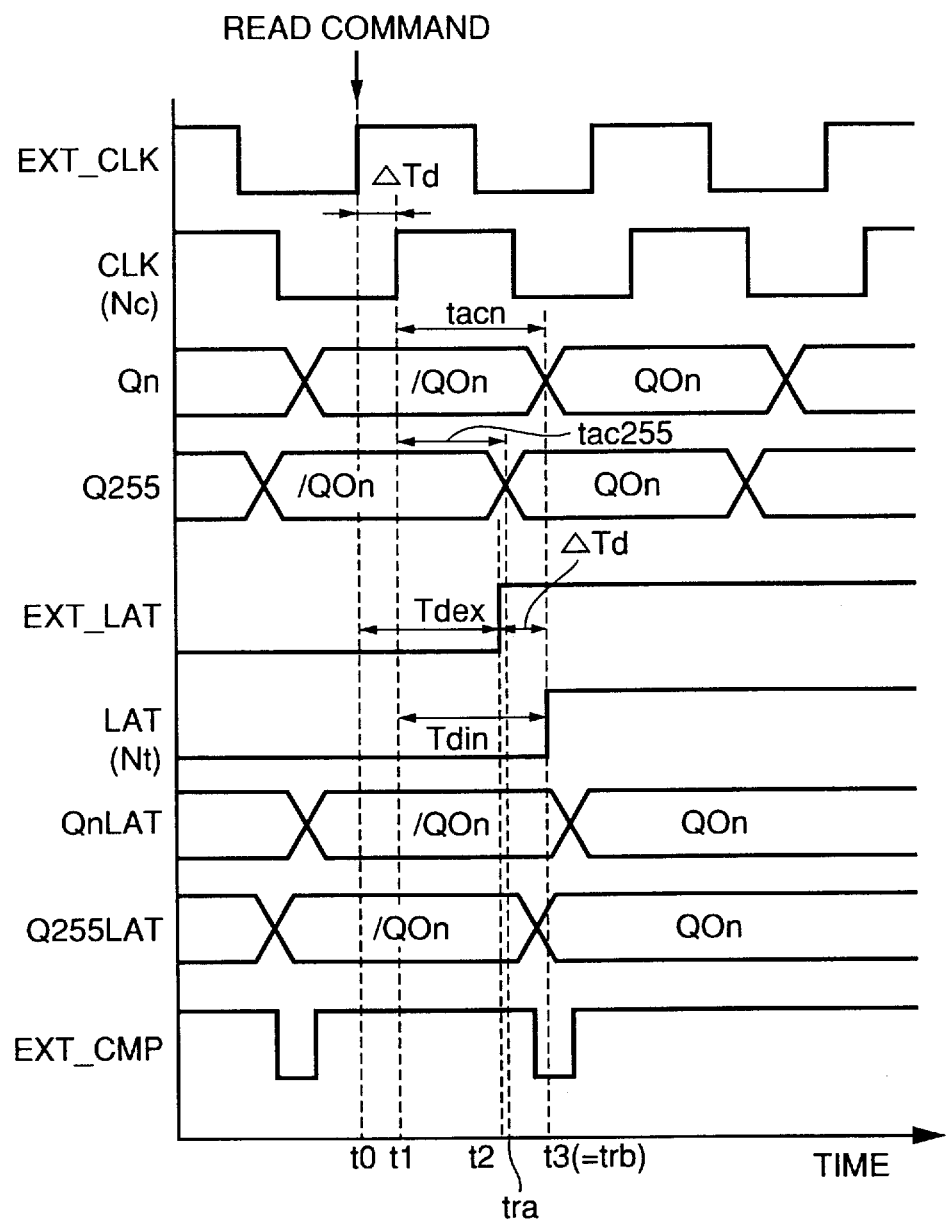
FIG. 21 is a third timing chart illustrating measurement of the access time in semiconductor integrated circuit device 140.

FIG. 21 shows an example in which the test timing difference Tdex is further increased so that Tdex (=Tdin)= tacn and Tdex (=Tdin)>tac255. Here, the data level of the test output data EXT_CMP is once changed to the L level after the time point t2, and returns to the H level after time point trb (t3), and maintained at the H level thereafter. When the test output data EXT_CMP exhibits such a behavior as shown in FIG. 21, it means that the test timing difference Tdex is not shorter than the access time tacn for the read data of the slowest access.

By this configuration, it becomes possible to execute access time measurement similar to that described with reference to the second embodiment with the number of data requiring monitoring reduced. Thus, the number of pins necessary at the time of access time measurement is reduced, and therefore, the number of semiconductor integrated circuit devices of which access time can be measured simultaneously in parallel can be increased.

Figure 22:
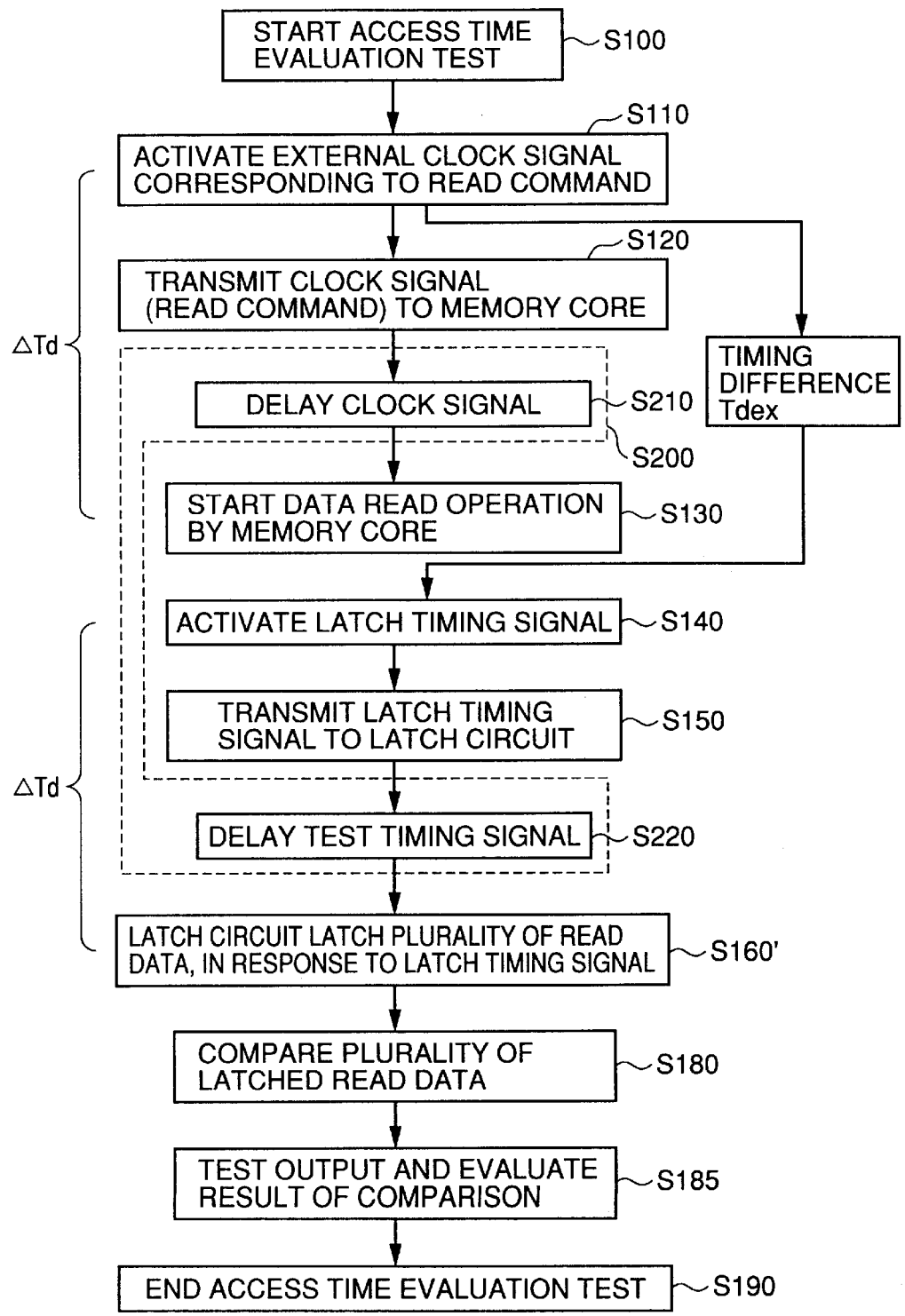
FIG. 22 is a flow chart representing the access time evaluating method in accordance with the fourth embodiment.

Referring to FIG. 22, in the method of evaluating access time in accordance with the fourth embodiment, execution of the steps from the start of access time evaluation test (step S110) until the latch timing signal LAT is transmitted to the latch circuit (step S150) and the execution of the step for adjusting the signal delays of the clock signal system (EXT_CLK, CLK) and the timing signal system (EXT_LAT, LAT) to be the same (step S200) are the same as described with reference to FIG. 9. Therefore, detailed description will not be repeated.

At the timing when the latch timing signal LAT is transmitted to latch circuit 70, latch circuit 70 latches the data level of the read data output from memory core 50. In the access time evaluating method in accordance with the fourth embodiment, the latch timing signal LAT is transmitted simultaneously to a plurality of latch circuits arranged in parallel, and the latch circuits latch a plurality of read data (step S160'). The plurality of latched read data are compared by data comparing circuit 90 (step S180). By externally extracting and evaluating the comparison result signal CMP generated by data comparing circuit 90 as the test output data (step S 185), it becomes possible to reduce the number of test output data to be monitored and to complete access time evaluation test (step S190).

[Modification of the Fourth Embodiment]

Figure 23:
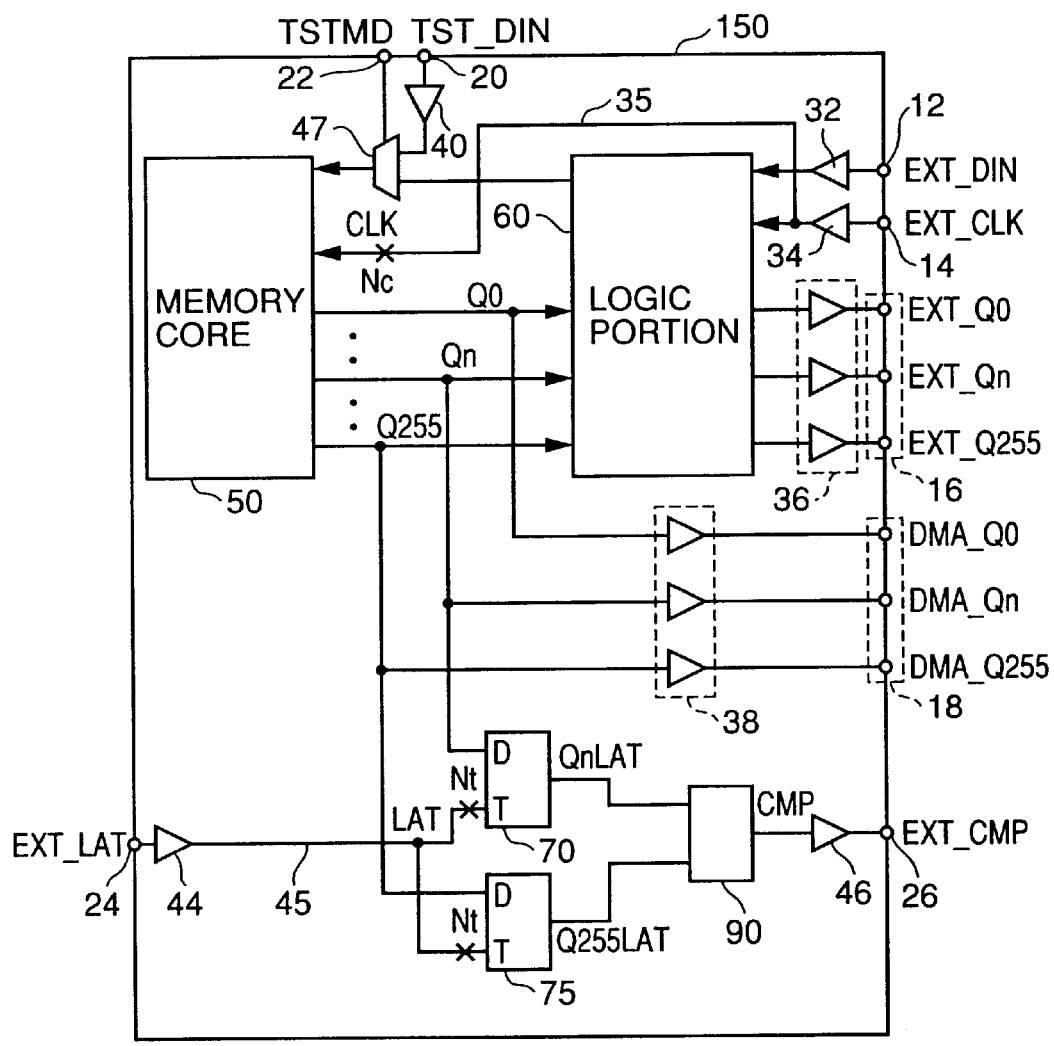
FIG. 23 is a block diagram representing a configuration of a semiconductor integrated circuit device 150 in accordance with a modification of the fourth embodiment.

Referring to FIG. 23, a semiconductor integrated circuit device 150 in accordance with a modification of the fourth embodiment differs from the semiconductor integrated circuit device 140 shown in FIG. 17 in that delay circuits 80 and 85 are not provided. Except this point, the device is the same as semiconductor integrated circuit device 140, and therefore, description thereof will not be repeated.

As already described, in the configuration of the semiconductor integrated circuit device in accordance with the fourth embodiment, as the data comparing circuit is arranged in a succeeding stage of the latch circuit, evaluation of the access time of a plurality of read data can be executed with high accuracy. Therefore, when the difference between the inherent signal delay ΔtdCLK of the clock signal system and the inherent signal delay ΔtdLAT of the test signal system related to the latch timing described above is sufficiently small, it is possible to measure the access time with high accuracy by the configuration of semiconductor integrated circuit device 150, without the necessity of providing delay circuits 80 and 85.

[Fifth Embodiment]

Figure 24:
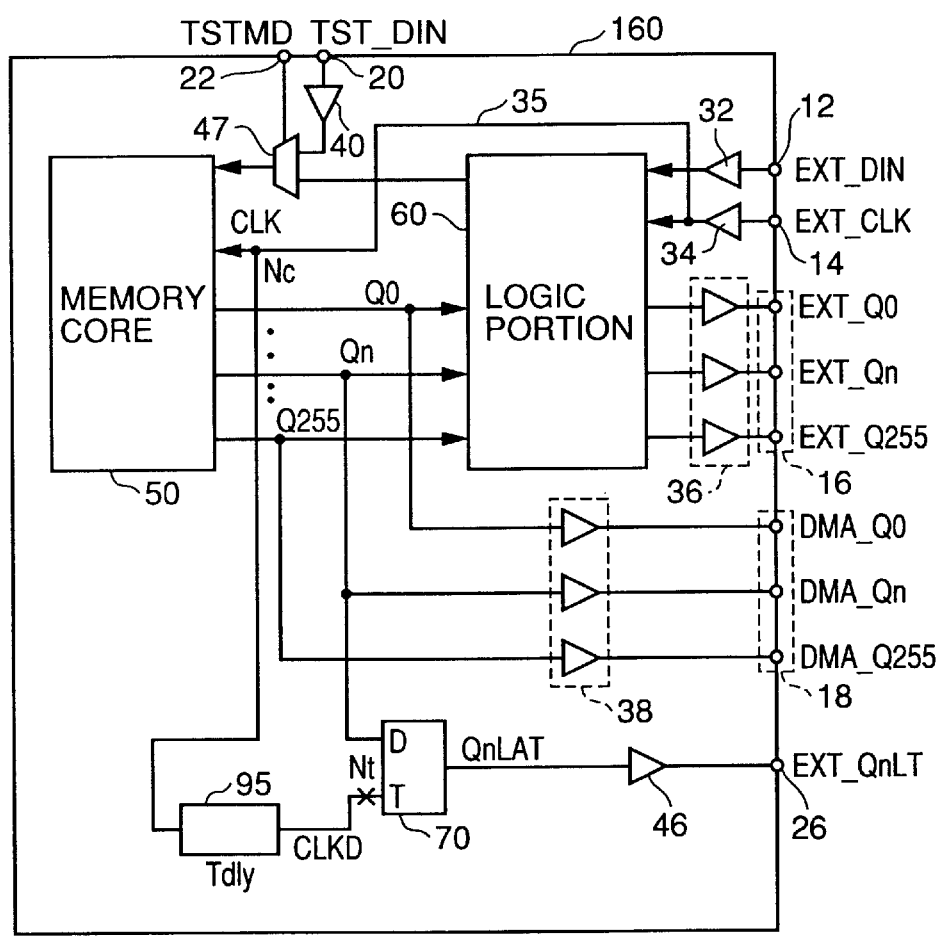
FIG. 24 is a block diagram representing a configuration of a semiconductor integrated circuit device 160 in accordance with a fifth embodiment of the present invention.

Referring to FIG. 24, a semiconductor integrated circuit device 160 in accordance with the fifth embodiment differs from the semiconductor integrated circuit device 110 shown in FIG. 5 in that it is unnecessary to externally input the test timing signal EXT_LAT for designating the data latch timing. Therefore, corresponding test signal input terminal 24, signal buffer 44 and signal line 45 are unnecessary. Further, in place of delay circuits 80 and 85, only the delay circuit 95 is provided between the clock input node Nc of memory core 50 and the timing control node Nt of latch circuit 70. Delay circuit 95 delays the clock signal CLK transmitted to clock input node Nc of the memory core 50, and transmits the clock signal CLKD to timing control node Nt of latch circuit 70.

Access time measurement in semiconductor integrated circuit device 160 will be described with reference to FIGS. 25 and 26.

Figure 25:
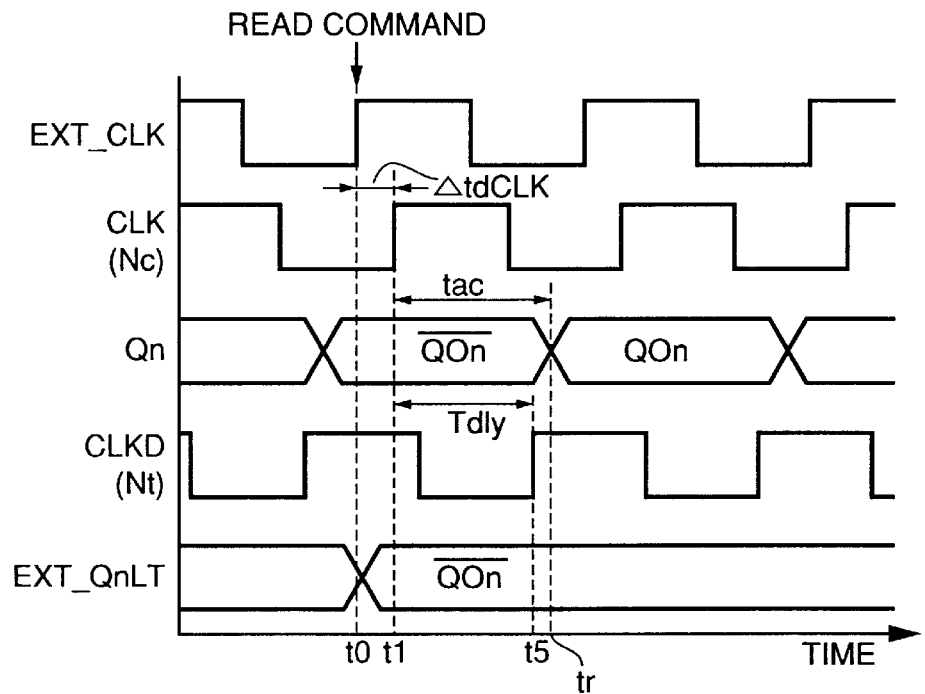
FIG. 25 is a first timing chart illustrating measurement of the access time in semiconductor integrated circuit device 160.

Referring to FIG. 25, when EXT_CLK is activated at time t0, the clock signal CLK rises at the clock input node Nc of memory core 50 at a time point t1 after the line delay ΔtdCLK of the clock signal system.

Further, at a time point t5 after the delay time Tdly of delay circuit 95 from the time point t1, the clock signal CLKD rises at the timing control node Nt of latch circuit 70. In response, latch circuit 70 latches the read data Qn from memory core 50. Therefore, in the semiconductor integrated circuit device 160, it is possible to determine which of the delay time Tdly set in delay circuit 95 and the access time tac of memory core 50 is longer or shorter, by monitoring the test output data EXT_QnLT.

FIG. 25 shows an example in which Tdly<tac, and before the data level QOn corresponding to the read command appears at read data Qn, the clock signal CLKD is activated, and therefore the data level of test output data EXT_QnLT as the output of latch circuit 70 is not changed from /QOn.

Figure 26:
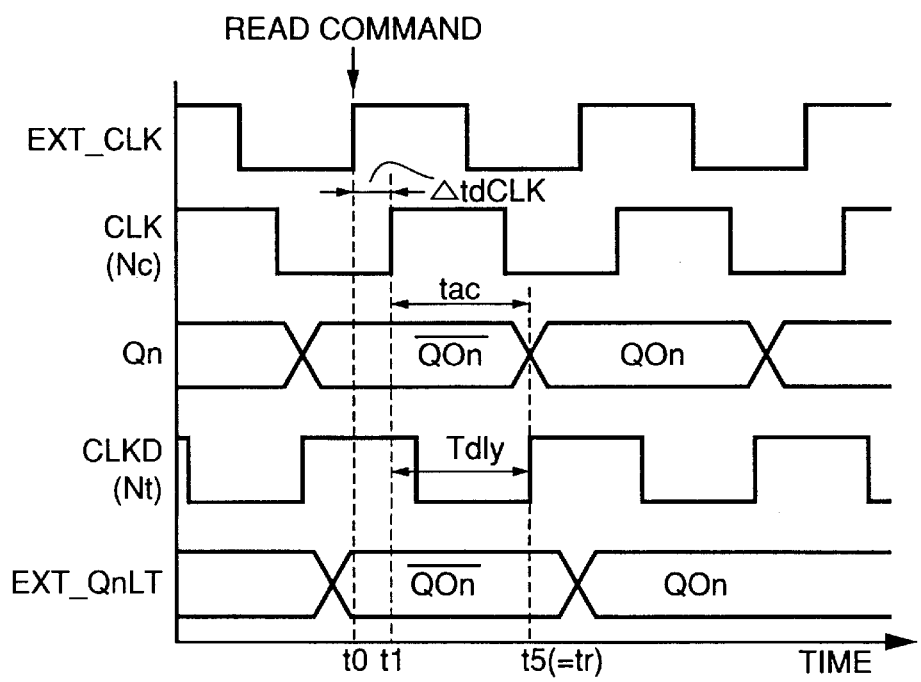
FIG. 26 is a second timing chart illustrating measurement of the access time in semiconductor integrated circuit device 160.

FIG. 26 shows an example in which Tdly =tac. At the activation timing of clock signal CLKD, the data level QOn corresponding to the read command appears at the read data Qn, and therefore the data level of test output signal EXT_QnLT changes from /QOn to QOn. When Tdly>tac, the data level of test output data EXT_QnLT is the same as in the example of FIG. 26. Therefore, the behavior of the test output data can be classified into two, that is, when Tdly<tac (FIG. 25) and when Tdly≧tac (FIG. 26).

When the delay time Tdly of delay circuit 95 is set at the standard value of the access time of memory core 50, it is possible to readily determine whether the memory core 50 satisfies the standard value of the access time, by the data level of test output dta EXT_QnLT.

By this configuration, it becomes possible to execute access time measurement without the necessity of externally inputting a timing signal for the test.

Accordingly, the number of input signals necessary for the test can be reduced and circuit group corresponding to such signals can be reduced. Therefore, the effect such as efficient operation test of access time evaluation and reduced circuit area can be attained.

Figure 27:
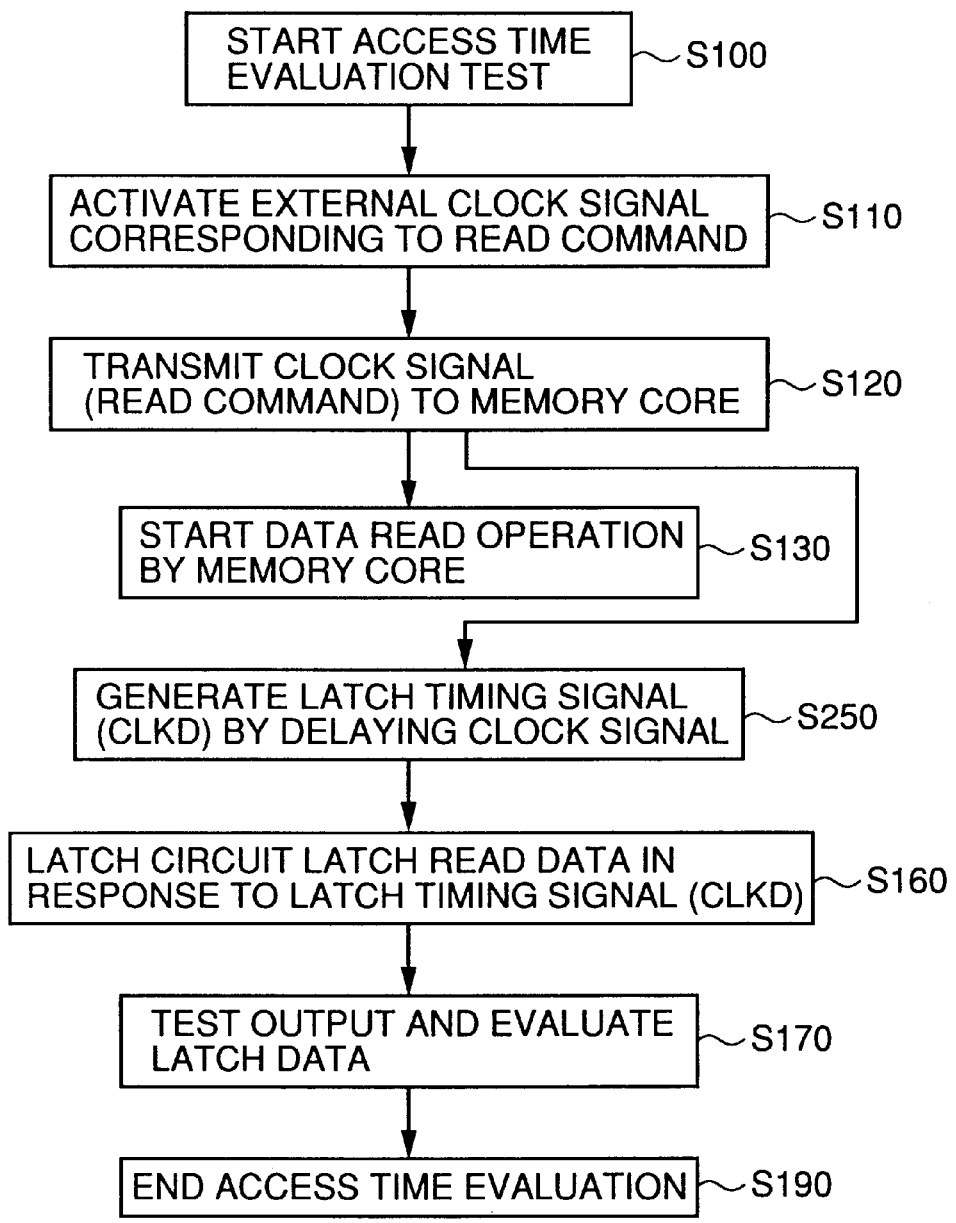
FIG. 27 is a flow chart illustrating the access time evaluating method in accordance with the fifth embodiment.

Referring to FIG. 27, in the method of evaluating access time in accordance with the fifth embodiment, when the access time evaluation test starts (step S100), the external clock signal EXT_CLK is activated in order to take the read command generated for access time evaluation into the semiconductor integrated circuit device 110 (step S110). Based on the external clock signal EXT_CLK, the clock signal CLK is generated and transmitted to the memory core (step S120) and, in response to the activation of clock signal CLK, reading operation of the memory core 50 starts (step S130).

Delay circuit 95 further delays the clock signal CLK transmitted to the memory core by Tdly, and generates a clock signal CLKD for designating a latch timing (step S250). In response to the activation timing of clock signal CLKD, latch circuit 70 latches the data level of the read data output from memory core 50 (step S160). When the data level of the read data latched by latch circuit 70 is output and evaluated (step S170), it becomes possible to complete access time evaluation test, by comparing the delay time Tdly of delay circuit 95 and access time tac.

[Modification of the Fifth Embodiment]

Figure 28:
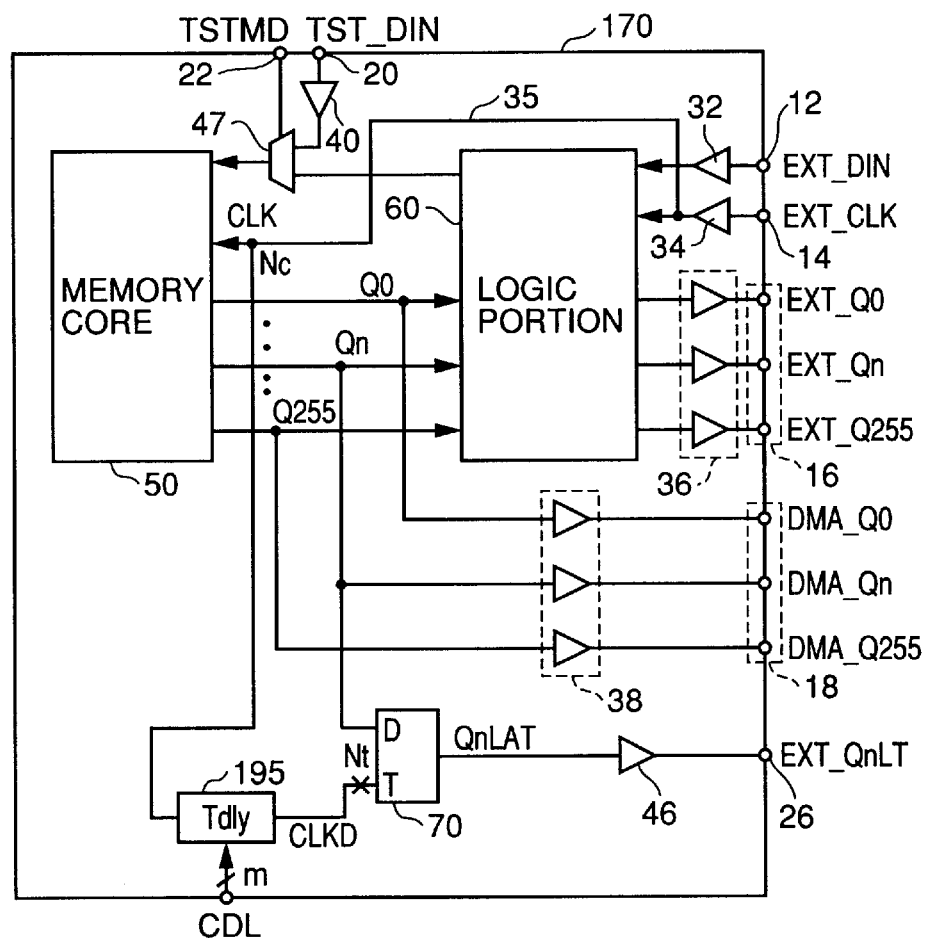
FIG. 28 is a block diagram representing a configuration of a semiconductor integrated circuit device 170 in accordance with the fifth embodiment of the present invention.

Referring to FIG. 28, a semiconductor integrated circuit device 170 in accordance with a modification of the fifth embodiment differs from the semiconductor integrated circuit device 160 shown in FIG. 24 in that in place of delay circuit 95, a delay circuit 195 is provided. Configurations and operations of other components are the same as those of semiconductor integrated circuit device 160, and therefore, description thereof will not be repeated.

Delay circuit 195 is different from delay circuit 95 shown in FIG. 24 in that it is possible to change the delay time Tdly by a control signal CDL.

Figure 29:
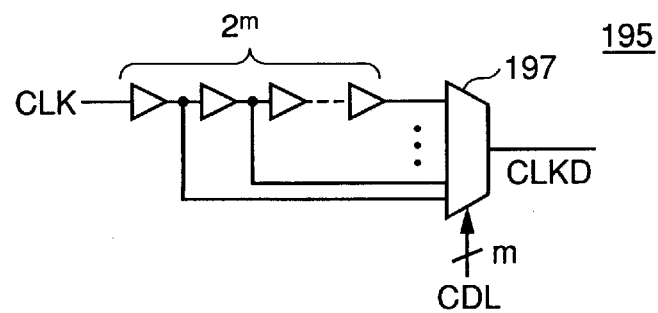
FIG. 29 is a schematic diagram showing an exemplary configuration of a delay circuit 195.
Figure 30:
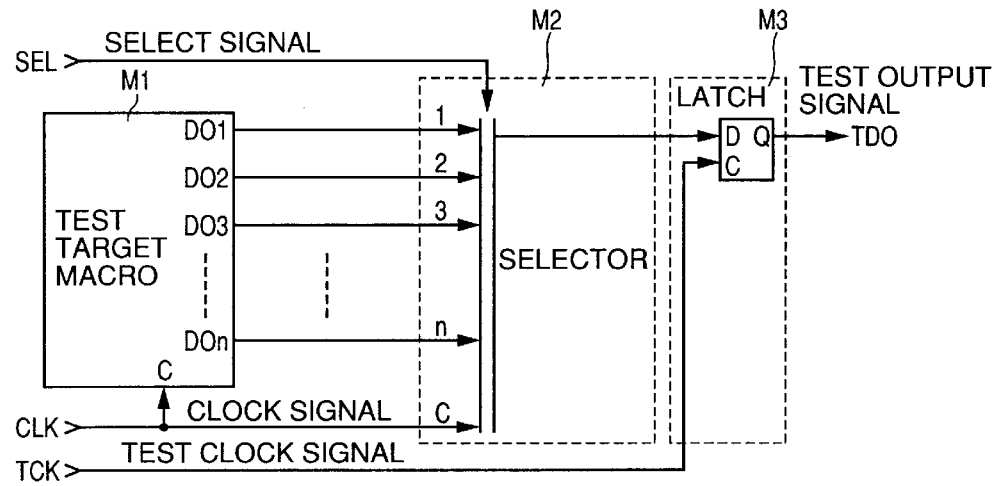
FIG. 30 is a block diagram showing a configuration of a first test circuit in accordance with the prior art technique.
Figure 31:
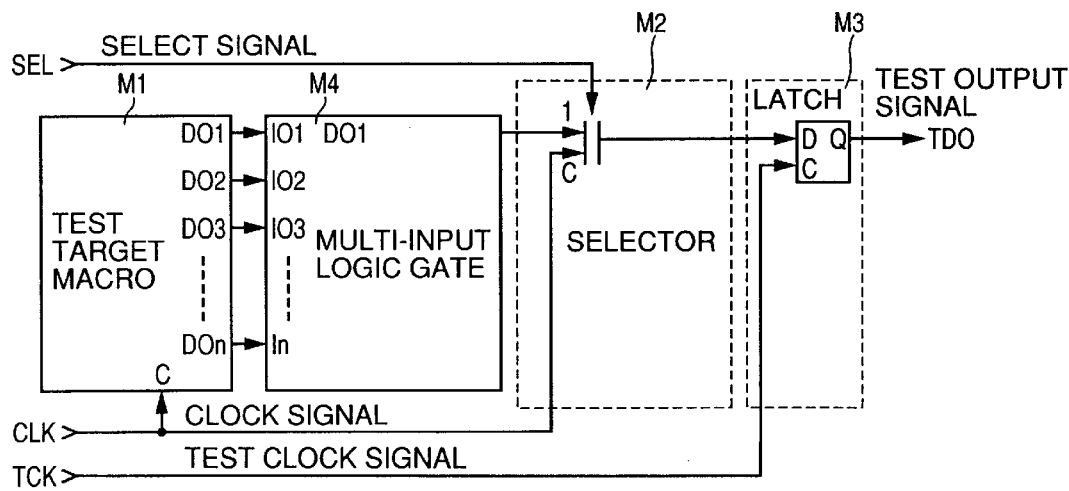
FIG. 31 is a block diagram showing a configuration of a second test circuit in accordance with the prior art technique.

Referring to FIG. 29, delay circuit 195 includes $2^m$ (m: natural number) signal buffers connected in series and receiving the clock signal CLK from clock input node Nc of memory core 50, and a selector 197 for selectively providing respective outputs of $2^m$ signal buffers.

Selector 197 receives respective outputs of $2^m$ signal buffers, executes $2^m$: 1 selection, and generates the clock signal CLKD. The $2^m$: 1 selection in selector circuit 197 is executed in accordance with an externally input control signal CDL. Here, assuming that the control signal CDL is a m-bit digital signal, it is possible to provide an output of one of the $2^m$ signal buffers connected in series as a clock signal CLKD from delay circuit 195.

By this configuration, it is possible to change the delay time Tdly of delay circuit 195. Therefore, it becomes possible to measure the access time by monitoring the signal level of the output test signal EXT_QnLT, while changing the control signal CDL.

Though memory core 50 included in semiconductor integrated circuit devices 110 to 170 is described as a synchronous type memory core operating in response to the external clock signal EXT_QLK, application of the present invention is not limited to evaluation of the access time of the synchronous memory core. More specifically, by applying control signals such as the row address strobe signal /RAS and column address strobe signal /CAS in place of the external clock signal EXT_QLK, the configuration of the present invention can be applied to a non-synchronous memory core.

Further, the external clock signal EXT_CLK and the test timing signal EXT_LAT have been described as supplied from the outside of the semiconductor integrated circuit devices 110 to 170, a BIST (Built in Self Test) circuit may be included in the semiconductor integrated circuit device, and these signals may be generated by the BIST circuit. In that case, the present invention may be applied, considering the signal delay between the BIST circuit and the memory core to be evaluated.

Though access time measurement has been described as a representative in the first to fifth embodiments, the configuration of the present invention is not limited to the measurement of the access time, and other AC characteristic of memory core 50 may be measured by appropriately changing the activation timings of control signals defining the latch timing and the data input to the latch circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
   a memory circuit executing a read operation in which a plurality of data are output in parallel, at least one of said plurality of data being transmitted to an internal node;
   a first signal transmitting path transmitting a control signal designating start of said read operation to said memory circuit;
   a first data latch circuit responsive to a test timing signal activated after a prescribed time period from activation of said control signal, for taking in and holding a signal level of said internal node;
   a second signal transmitting path transmitting said test timing signal to said first data latch circuit; and
   a signal delay circuit arranged in at least one of said first and second signal transmitting paths so as to align signal propagation delays in said first and second signal transmitting circuits.

2. The semiconductor integrated circuit device according to claim 1, wherein
   said at least one of said plurality of data is determined in accordance with expected time necessary for said read operation based on a layout design of said memory circuit, for each of said plurality of data.

3. The semiconductor integrated circuit device according to claim 1, further comprising second to Nth data latch circuits responsive to test timing signals received from said second signal transmitting circuit, for taking in and holding other (N−1) (N: natural number not smaller than 2) data of said plurality of data.

4. The semiconductor integrated circuit device according to claim 3, wherein
   N is 2; and
   one and another one of said plurality of data are determined in accordance with expected time necessary for said read operation based on a layout design of said memory circuit for each of said plurality of data.

5. The semiconductor integrated circuit device according to claim 3, further comprising a data comparing circuit for comparing result of comparison between each of said plurality of data held in said first to Nth data latch circuits.

6. The semiconductor integrated circuit device according to claim 5, wherein
   N=2: and
   one and another one of said plurality of data are determined in accordance with expected time necessary for said read operation based on a layout design of said memory circuit for each of said plurality of data.

7. The semiconductor integrated circuit device according to claim 1, further comprising
   a data comparing circuit arranged between said memory circuit and said first data latch circuit, for outputting, to said internal node, result of comparison between one and other M (M: natural number) of said plurality of data lines.

8. The semiconductor integrated circuit device according to claim 7, wherein
   M is 1; and
   one and another one of said plurality of data are determined in accordance with an expected time necessary for said read operation based on a layout design of said memory circuit, for each of said plurality of data.

9. The semiconductor integrated circuit device according to claim 1, wherein
   said prescribed time period is set in accordance with a standard value of an access time of said memory circuit.

* * * * *